(12) United States Patent
Lee

(10) Patent No.: US 7,616,015 B2
(45) Date of Patent: Nov. 10, 2009

(54) WAFER TYPE PROBE CARD, METHOD FOR FABRICATING THE SAME, AND SEMICONDUCTOR TEST APPARATUS HAVING THE SAME

(75) Inventor: Chang-hwan Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 84 days.

(21) Appl. No.: 11/892,433

(22) Filed: Aug. 23, 2007

(65) Prior Publication Data
US 2008/0048689 A1 Feb. 28, 2008

(30) Foreign Application Priority Data
Aug. 23, 2006 (KR) .................... 10-2006-0079987

(51) Int. Cl.
*G01R 31/02* (2006.01)
(52) U.S. Cl. ....................... 324/754; 324/761
(58) Field of Classification Search ........................ None
See application file for complete search history.

(56) References Cited

U.S. PATENT DOCUMENTS

| | | | |
|---|---|---|---|
| 6,215,321 B1 * | 4/2001 | Nakata | 324/754 |
| 6,614,246 B1 * | 9/2003 | Kohno et al. | 324/754 |
| 6,970,005 B2 * | 11/2005 | Rincon et al. | 324/754 |
| 7,292,055 B2 * | 11/2007 | Egitto et al. | 324/754 |
| 2004/0012405 A1 * | 1/2004 | Cheng et al. | 324/761 |
| 2005/0101037 A1 * | 5/2005 | Farnworth et al. | 438/14 |

FOREIGN PATENT DOCUMENTS

| | | |
|---|---|---|
| JP | 2000-357718 | 12/2000 |
| JP | 2001-210685 | 8/2001 |
| KR | 10-0214162 | 5/1999 |

* cited by examiner

*Primary Examiner*—Minh N Tang
(74) *Attorney, Agent, or Firm*—Harness, Dickey & Pierce, PLC

(57) ABSTRACT

Example embodiments may provide a wafer type probe card, a method of fabricating a wafer type probe card, and/or a semiconductor test apparatus having the wafer type probe card. The wafer type probe card may include a semiconductor and a plurality of probing chips. The semiconductor substrate may include a plurality of probing area each including a first surface and/or a second surface opposite to the first surface. Each of the plurality of probing chips may include a plurality of conductive first pads arranged in the first surface of each of the plurality of probing areas and/or a plurality of conductive second pads arranged in the second surface of each the plurality of probing chips to be respectively connected to the first pads.

19 Claims, 19 Drawing Sheets

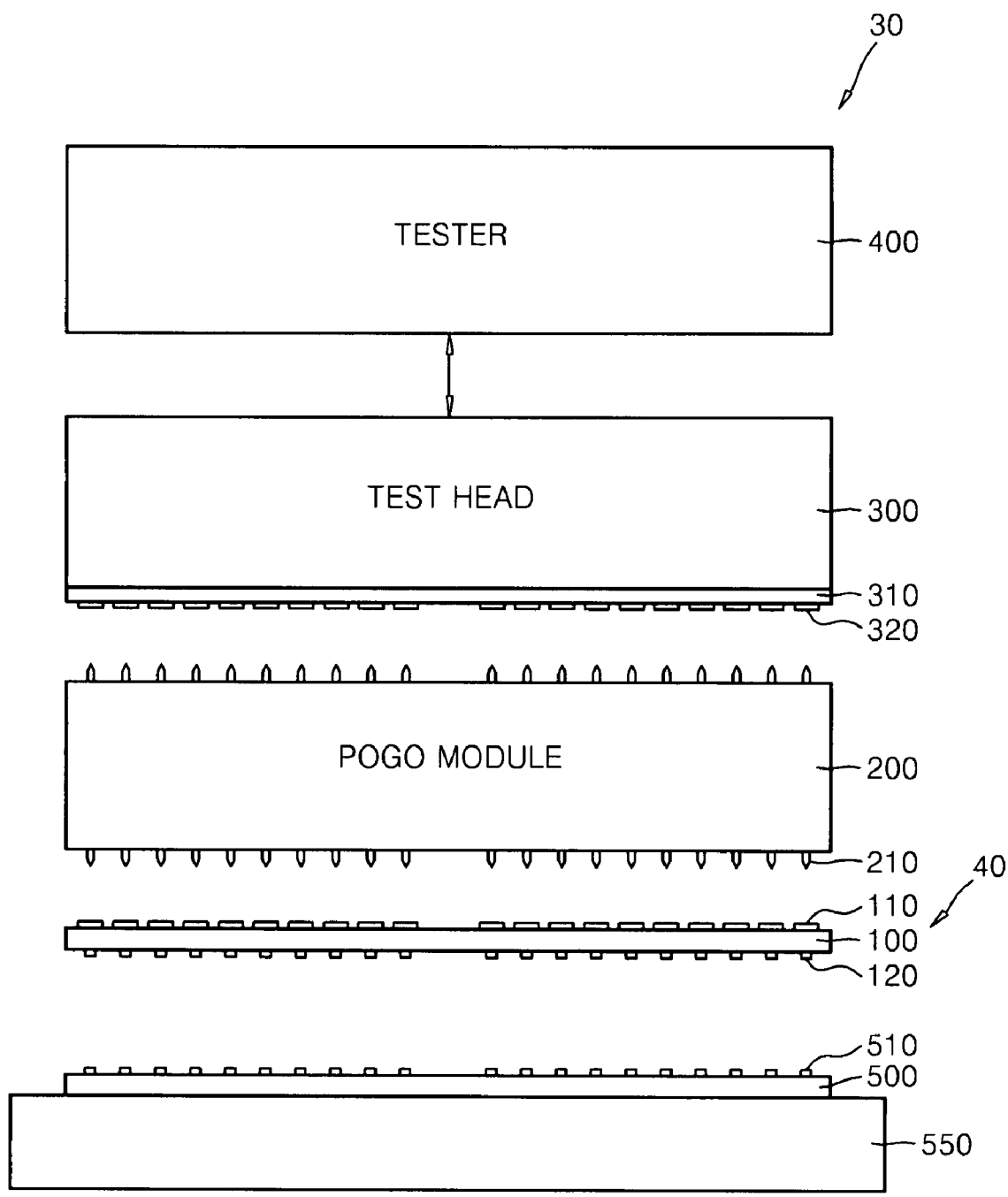

WAFER TYPE PROBE CARD, METHOD FOR FABRICATING THE SAME, AND SEMICONDUCTOR TEST APPARATUS HAVING THE SAME

PRIORITY STATEMENT

This non-provisional patent application claims priority under 35 U.S.C. § 119 to Korean Patent Application No. 10-2006-0079987, filed on Aug. 23, 2006, in the Korean Intellectual Property Office, the entire contents of which is incorporated herein in its entirety by reference.

BACKGROUND

1. Field

Example embodiments may relate to a semiconductor test apparatus, for example, to a wafer-type probe card, a method for fabricating a wafer-type probe card, and/or a semiconductor test apparatus having the wafer type probe card.

2. Description of the Related Art

Related art semiconductor devices may be manufactured through a series of semiconductor fabricating processes including a process of fabricating a semiconductor wafer, a process of fabricating a plurality of semiconductor chips on the semiconductor wafer, a process of performing an electrical die sorting (EDS) test on the plurality of semiconductor chips to determine whether the semiconductor chips are, defective, a process of packaging non-defective semiconductor chips, and/or a process of finally testing the packaged semiconductor chips. The EDS test process may determine whether the semiconductor chips formed on the wafer are electrically defective and may use a test apparatus that applies an electrical signal to the semiconductor chips to perform this determination. A related art EDS test apparatus may include a tester generating an electrical signal and/or a probe card including a plurality of needles to transmit the electrical signal to electrodes on semiconductor chips on a semiconductor wafer. The probe card may transmit the electric signal generated by the tester to the wafer through the needles contacting the wafer and/or from the wafer to the tester.

FIG. 1A is a plan view illustrating a related art probe card, and FIG. 1B is a schematic cross-sectional view illustrating the related art probe card of FIG. 1A. As shown in FIGS. 1A and 1B, a related art probe card 10 may include a printed circuit board (PCB) 11 having a penetration hole 15 in the center and/or a plurality of probe pins 13 attached on a lower surface of the PCB 11. The probe pins 13 may be supported by a support member 18. A pad 17 may be on an upper surface of the PCB 11 and may be electrically connected to a connection PCB (not shown in FIG. 1B).

If an EDS test is performed on a semiconductor wafer 20 using the related art probe card 10, a bonding pad (not shown) of a semiconductor chip of the semiconductor wafer 20 mounted on a wafer stage 21 may contact the probe pins 13 of the probe card 10. A test signal may be transmitted from a tester (not shown) to the semiconductor chip of the semiconductor wafer 20 through the probe card 10, and an electrical property signal may be transmitted from the semiconductor chip to the tester through the probe card 10. The tester may determine whether the semiconductor chip is defective based on the electrical property signal provided from the semiconductor chip.

A related art probe card may test one semiconductor chip at a time and may result in a high precision test. A related art probe card may require a long test time to test a plurality of semiconductor chips on a wafer. Yield and productivity may be reduced for a related art probe card test. A multi-type probe card may probe a plurality of semiconductor chips at a time and may reduce a test time and improve productivity. Precision of the multi-type probe card may be lower. Because the related art probe card may be expensive, cost for fabricating a semiconductor device may be increased.

SUMMARY

Example embodiments may provide a wafer type probe card including pads in a substantially similar arrangement as pads on a semiconductor wafer, a method for fabricating the same, and/or a semiconductor test apparatus having the wafer type probe card.

Example embodiments may provide a wafer type probe card simultaneously probing a plurality of semiconductor chips on a semiconductor wafer, a method for fabricating the same, and/or a semiconductor test apparatus having the wafer type probe card.

Example embodiments may provide a wafer type probe card that includes a semiconductor substrate and/or a plurality of probing chips. The semiconductor substrate may include a plurality of probing areas each including a first surface and a second surface opposite to the first surface. The plurality of probing chips may each include a plurality of conductive first pads arranged on the first surface of each of the plurality of probing areas and/or a plurality of conductive second pads arranged in the second surface of each of the plurality of probing areas and each respectively connected to each of the plurality of conductive first pads.

The plurality of probing chips may respectively and simultaneously probe the plurality of semiconductor chips arranged on a semiconductor wafer so that the probe card may simultaneously probe the plurality of semiconductor chips arranged on the semiconductor wafer. The probe chips may correspond to each of the plurality of semiconductor chips on the semiconductor wafer, each including a plurality of third pads. One or more pads of the plurality of conductive first or second pads may respectively contact the plurality of third pads. Other pads that do not contact the third pads may be larger in size than the pad or pads of the first or second pads contacting the third pads.

The first pads may be buried in the first surface of the semiconductor substrate so that a surface of each of the first pads may protrude from the first surface. The second pads may be buried in the second surface so that a surface of the second pads may protrude from the second surface. The probing chips may include conductive connection wires buried in the semiconductor substrate such that the first and second pads may be electrically connected to each other through the conductive connection wires.

The first pad may include a conductive first connection wire buried in the first surface of the semiconductor substrate and/or first conductive pattern arranged on the first connection wire to protrude from the first surface of the semiconductor substrate. The second pad may include a conductive second connection wire buried in the second surface of the semiconductor substrate and/or second conductive, pattern arranged on the second connection wire to protrude from the second surface of the semiconductor substrate such that the first connection wire of the first pad may be electrically connected to the second connection wire of the second pad.

The probing chips may include conductive connection wires buried in the first surface of the substrate such that the first pads are buried in the first surface and may protrude from the first surface of the semiconductor substrate so as to electrically contact each connection wire. The second pads may be on the connection wires to protrude from the second surface of the semiconductor substrate.

The first pads may include a conductive first connection wire buried in the first surface of the semiconductor substrate and/or a first conductive ball on the first connection wire that may protrude from the first surface of the semiconductor substrate. The second pad may include a conductive second connection wire buried in the second surface of the semiconductor substrate and/or a second conductive ball on the second connection wire to protrude from the second surface of the semiconductor substrate, wherein the first connection wire of the first pad may be electrically connected to the second connection wire of the second pad.

Example embodiments may provide a semiconductor test apparatus for testing electrical properties of a plurality of semiconductor chips arranged on a semiconductor wafer, each of the plurality including a plurality of third pads. The semiconductor test apparatus may include a test head, a probe card, and/or a pogo module. The test head may include a performance board including a plurality of signal pads and/or may apply test signals to the plurality of signal pads of the performance board to test the electrical properties of the semiconductor chips. The probe card may include a semiconductor substrate and/or a plurality of probing chips. The semiconductor substrate may include a plurality of probing areas each of which may include first surfaces and/or a second surfaces opposite to the first surface. Each of the plurality of probing chips may include a plurality of conductive first pads arranged on the first surfaces of the probing areas and/or a plurality of conductive second pads arranged on the second surfaces of the probing areas to respectively contact the plurality of conductive first pads. The pogo module may contact the signal pads of the performance board and/or the first pads of the probe card.

Example embodiments may provide a method of fabricating a wafer type probe card. A semiconductor substrate that may include a plurality of probing areas with a first surface and a second surface opposite to the first surface may be provided. A plurality of first pads may be formed in each of the probing areas of the semiconductor substrate to be buried in portions of the first surface so that a surface of each of the first pads may protrude from the first surfaces. A plurality of second pads may be formed in each of the probing areas of the semiconductor substrate to be buried in portions of the second surface so that a surface of each of the second pads may protrude from the second surface and may electrically contact the first pads.

Example embodiment methods may include forming connection wires buried in the probing area of the semiconductor substrate, wherein the first pads may be electrically connected to the second pads through the connection wires.

The forming of the first pads in the probing area of the semiconductor substrate may include forming a first mask pattern on the first surface in the probing area of the semiconductor substrate, wherein the first mask pattern may include first openings exposing portions of the first surface of the semiconductor substrate, etching the exposed portions of the first surface using the first mask pattern to form first grooves in the first surface, burying a first metal material in the first grooves and the first openings to form the first pads, and/or removing the first mask pattern. The forming of the second pads in the probing areas of the semiconductor substrate may include forming a second mask pattern on the second surface in the probing area of the semiconductor substrate, wherein the second mask pattern may include second openings exposing portions of the second surface in the probing area of the semiconductor substrate, etching the exposed portions of the second surface using the second mask pattern to form second groves in the second surfaces, burying a second metal material in the second grooves and the second openings to form the second pads, and/or removing the second mask patterns.

The forming of the first pads in the probing area of the semiconductor substrate may include forming a first mask pattern on the first surface in the probing area of the semiconductor substrate, wherein the first mask pattern may expose portions of the first surface in the probing area of the semiconductor substrate, etching the exposed portions of the first surface using the first mask pattern to form first grooves in the first surface, burying a first metal material in the first grooves to form first connection wires, removing the first mask pattern, and/or forming first conductive patterns on the first connection wires to form the first pads including the first connection wires and the first conductive patterns. The forming of the second pads in the probing areas of the semiconductor substrate may include forming second mask pattern on the second surfaces of the semiconductor substrate, wherein the second mask pattern may expose portions of the second surface in the probing area of the semiconductor substrate, etching the exposed portions of the second surface using the second mask pattern to form second groves in the second surfaces, burying a second metal material in the second grooves to form second connection wires contacting the first connection wires, removing the second mask patterns, and/or forming second conductive patterns on the second connection wires to form the second pads including the second connection wires and the second conductive patterns.

The forming of the first pads in the probing area of the semiconductor substrate may include forming first mask pattern on the first surface in the probing area of the semiconductor substrate, wherein the first mask pattern may expose portions of the first surface in the probing area of the semiconductor substrate, etching the exposed portions of the first surface using the first mask pattern to form first grooves in the first surfaces, burying a first metal material in the first grooves to form first connection wires, removing the first mask pattern, and/or forming first conductive balls on the first connection wires to form the first pads including the first connection wires and the first conductive balls. The forming of the second pads in the probing area of the semiconductor substrate may include forming a second mask pattern on the second surface in the probing area of the semiconductor substrate, wherein the second mask pattern may expose portions of the second surface in the probing area of the semiconductor substrate, etching the exposed portions of the second surface using the second mask pattern to form second groves in the second surface, burying a second metal material in the second grooves to form second connection wires contacting the first connection wires, removing the second mask pattern, and/or forming second conductive balls on the second connection wires to form the second pads including the second connection wires and the second conductive balls.

BRIEF DESCRIPTION OF THE DRAWINGS

The above and/or other aspects and advantages will become more apparent from the following detailed description of example embodiments taken in conjunction with the accompanying drawings of which:

FIG. 2 is a schematic view illustrating an example embodiment semiconductor test apparatus having a wafer type probe card;

DETAILED DESCRIPTION OF EXAMPLE EMBODIMENTS

Figure 1A:
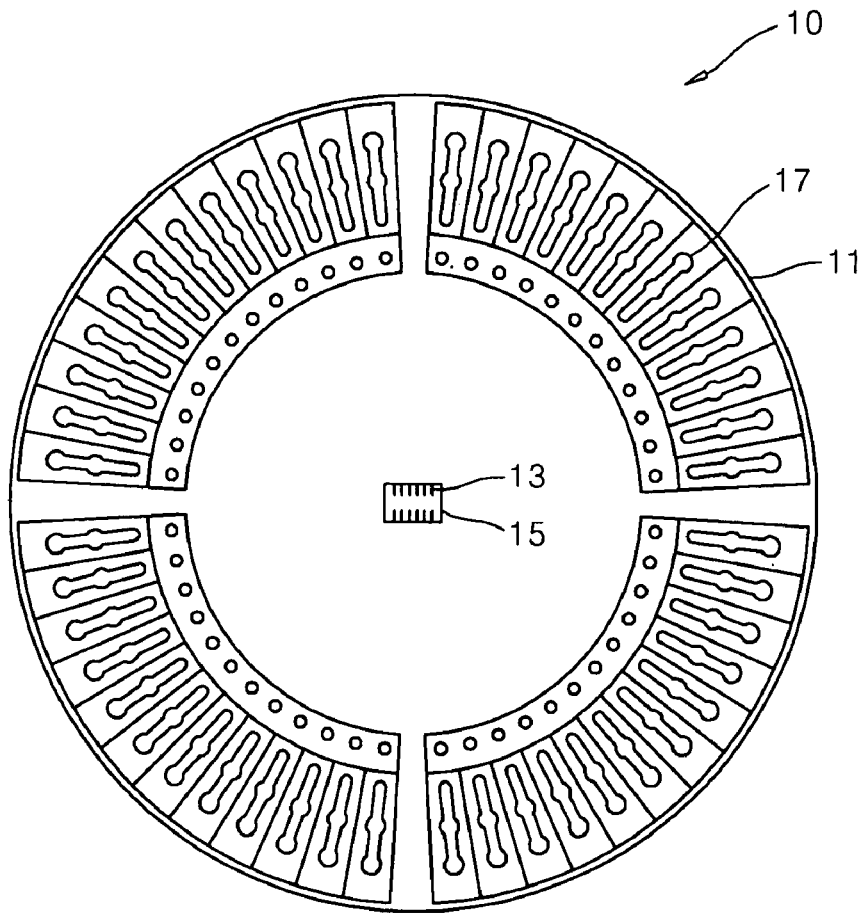
FIG. 1A is a plan view illustrating a related art probe card.
Figure 1B:
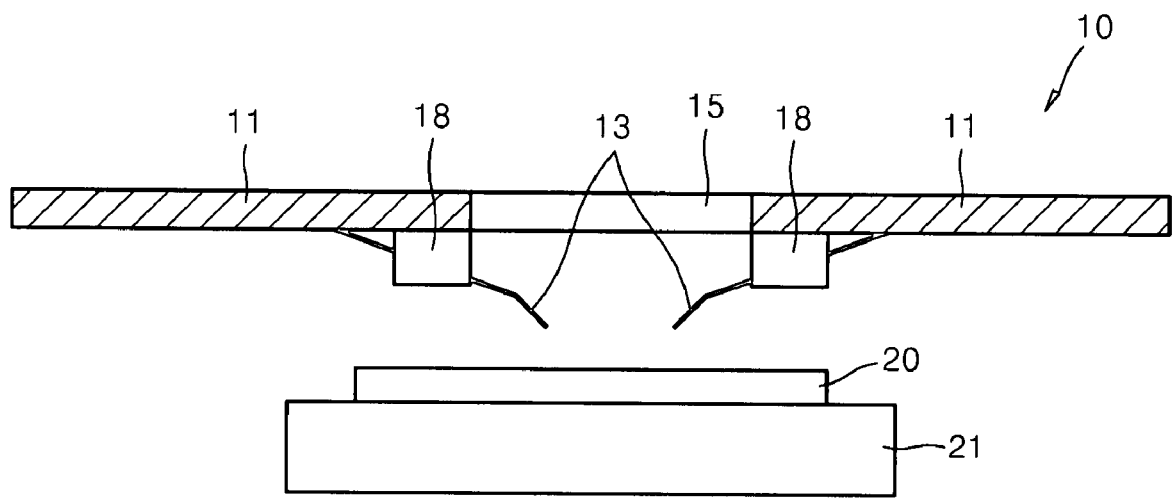
FIG. 1B is a schematic cross-sectional view illustrating the related art probe card illustrated in FIG. 1A.

Example embodiments will now be described more fully hereinafter with reference to the accompanying drawings. Embodiments may, however, be in many different forms and should not be construed as being limited to the example embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when a component is referred to as being "on," "connected to" or "coupled to" another component, it can be directly on, connected to or coupled to the other component or intervening components may be present. In contrast, when a component is referred to as being "directly on," "directly connected to" or "directly coupled to" another component, there are no intervening components present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one component or feature's relationship to another component(s) or feature(s) as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Reference will now be made to example Embodiments, which are illustrated in the accompanying drawings, wherein like reference numerals refer to the like components throughout.

FIG. 2 is a schematic view illustrating an example embodiment semiconductor test apparatus having a wafer type probe card. As shown in FIG. 2, a semiconductor test apparatus 30 may include a probe card 40, a pogo module 200, a test head 300, and/or a tester 400. The probe card 40 may include a plurality of first pads 110 arranged on a first surface of a semiconductor substrate 100 and/or a plurality of second pads 120 arranged on a second surface of the semiconductor substrate 100. The probe card 40 may be a wafer type. The plurality of second pads 120 may be electrically connected to a plurality of third pads 510 arranged on a semiconductor wafer 500 so as to transmit test signals from the test head 300 to the plurality of third pads 510 of the semiconductor wafer 500 and/or transmit electrical property signals from the plurality of third pads 510 of the semiconductor wafer 500 to the test head 300. The semiconductor wafer 500 may be mounted on a wafer station 550.

Figure 3:
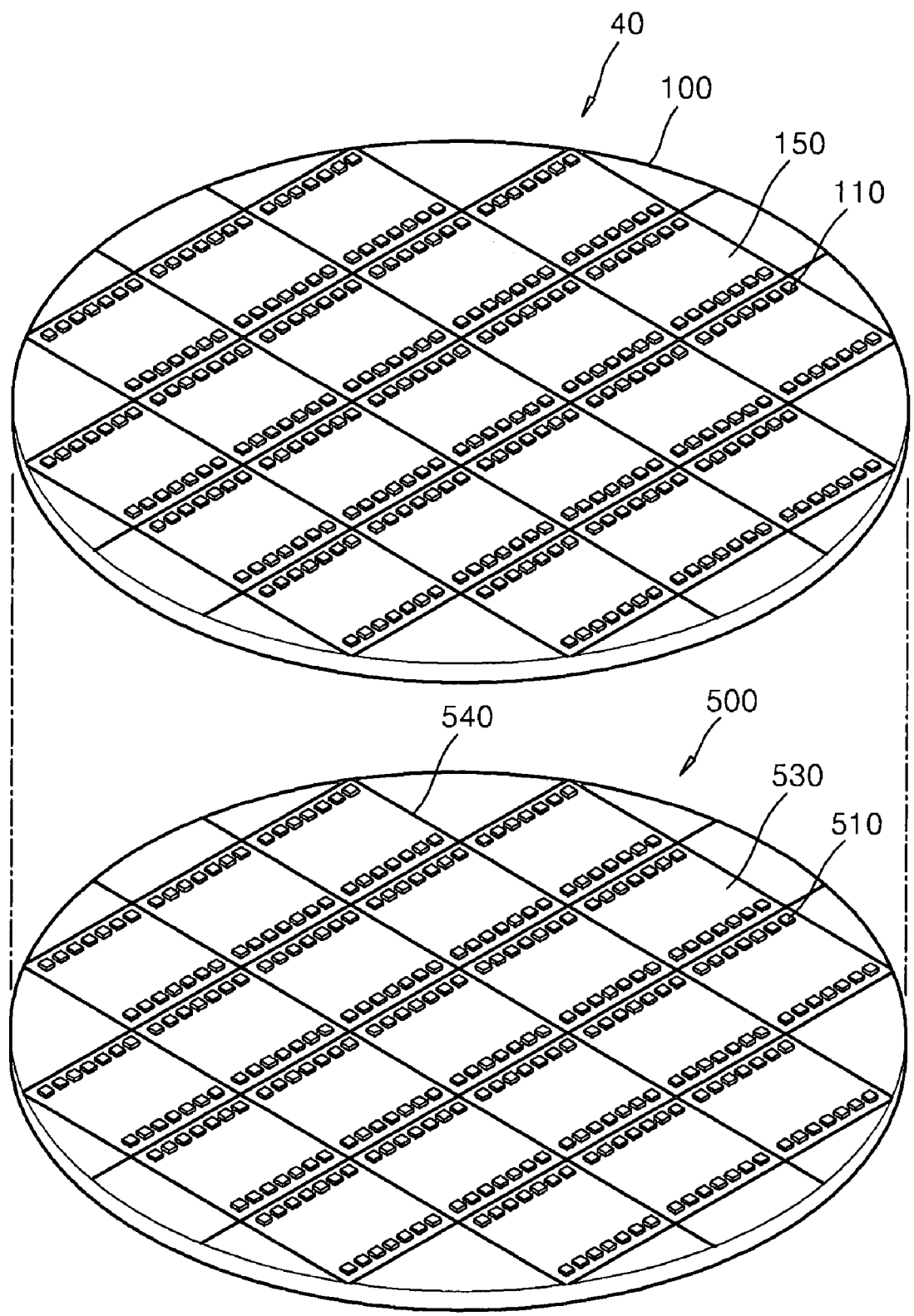
FIG. 3 is a perspective view illustrating an example embodiment wafer type probe card.

The tester 400 may provide the test signals to the test head 300 and/or may receive electric property signals from the test head 300 to determine whether semiconductor chips 530 of FIG. 3 arranged on the semiconductor wafer 500 are defective. A performance board 310 may be mounted on the test head 300 and/or may include a plurality of signal pads 320 used to transmit a signal to the probe card 40. The test head 300 may apply test signals to the performance board 310 to test electrical properties of the semiconductor chips 530 arranged on the semiconductor wafer 500. The pogo module 200 may include a plurality of pogo pins 210 to electrically connect the signal pads 320 of the performance board 310 to the first pads 110 of the probe card 40. The performance board 310 and the pogo module 200 may include a printed circuit board (PCB) (not shown).

Figure 4A:
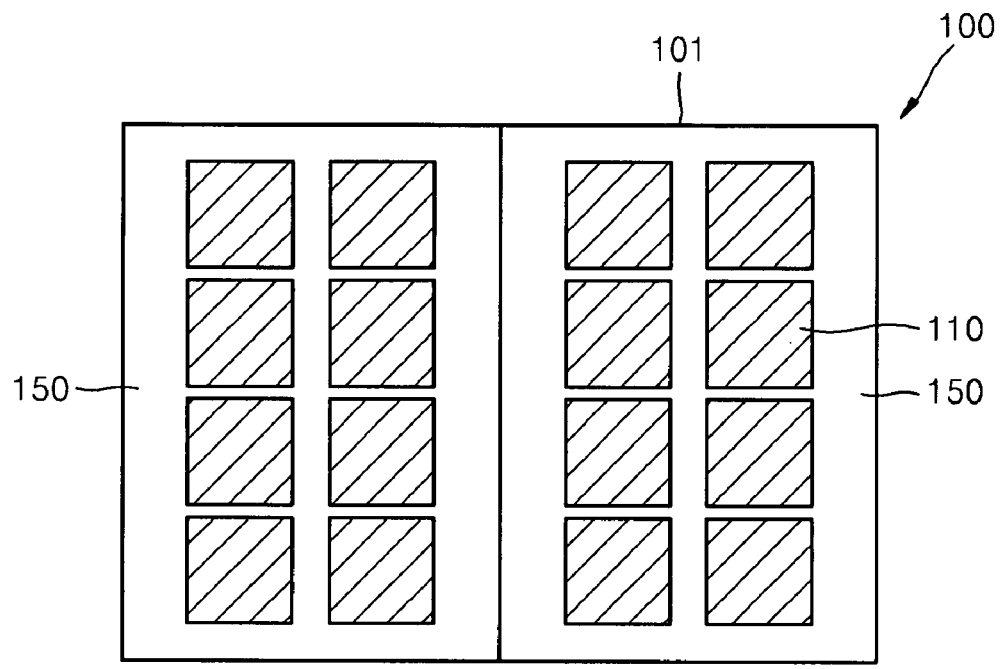
FIGS. 4A and 4B are plan views illustrating arrangement states of first and second pads arranged on first and second surfaces of the example embodiment wafer type probe card illustrated in FIG. 3.
Figure 4B:
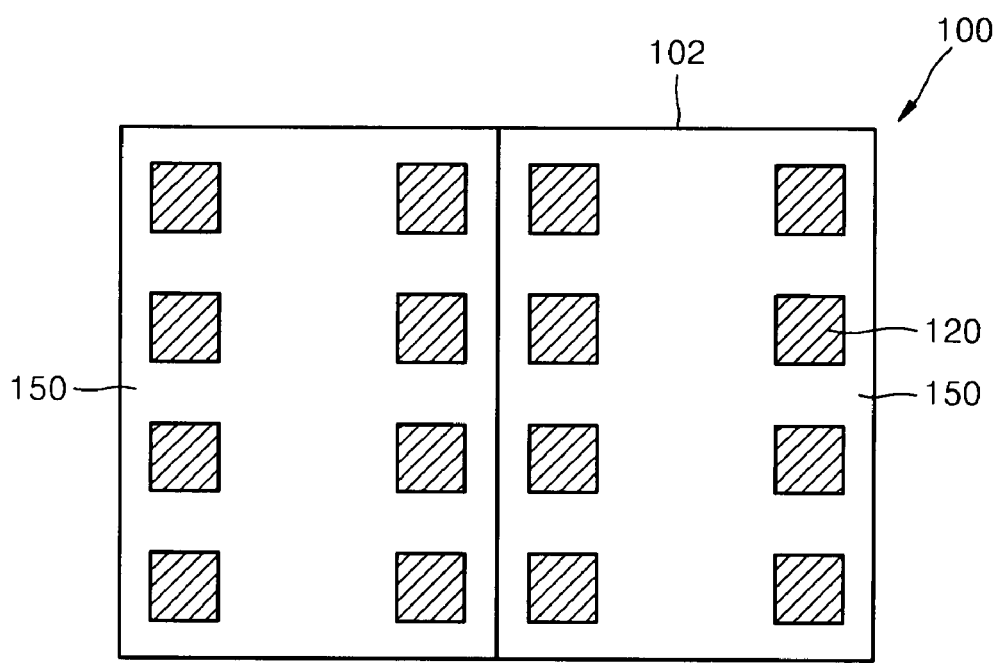

FIG. 3 is a perspective view illustrating an example embodiment wafer type probe card. FIGS. 4A and 4B are plan views illustrating arrangement states of first and second pads on first and second surfaces of the wafer type probe card illustrated in FIG. 3. As shown in to FIGS. 3, 4A, and 4B, a probe card 40 may include a semiconductor substrate 100 and/or a plurality of probing chips 150 arranged in probing areas of the semiconductor substrate 100. Each of the probing chips 150 may include a plurality of conductive first pads 110 arranged on a first surface 101 of each of the probing areas of the semiconductor substrate 100 and/or a plurality of conductive second pads 120 arranged on a second surface 102 of each of the probing areas. A semiconductor wafer 500 with electrical properties being tested by the probe card 40 may include a plurality of semiconductor chips 530 arranged in a plurality of semiconductor chip areas divided by scribe lanes 540. Each of the semiconductor chips 530 may include a plurality of third pads 510. The plurality of probing chips 150 of the probe card 40 may correspond to the plurality of semiconductor chips 530 of the semiconductor wafer 500 on a one-to-one basis. The second pads 120 arranged on each of the probing chips 150 may correspond to the third pads 510 arranged on each of the semiconductor chips 530 on a one-to-one basis.

The probe card 40 may be a wafer type probe card, and the third pads 510 of the semiconductor wafer 500 may mirror the configuration of the second pads 120. In a process of testing electrical properties, the second pads 120 of each of the probing chips 150 may contact the third pads 510 of each of the semiconductor chips 530 so as to test electrical properties. The probe card 40 may probe the plurality of semiconductor chips 530 through the plurality of probing chips 150 in order to simultaneously test the semiconductor chips 530 on the semiconductor wafer 500. Because the second pads 120 of the probe card 40 mirror the configuration of the third pads 510 on the semiconductor wafer 500, the probe card 40 may test electrical properties of the semiconductor chips 530 arranged on the semiconductor wafer 500 simultaneously.

The first pads 110 arranged on the first surface 101 of each of the probing chips 150 may be electrically connected to the second pads 120 arranged on the second surface 102. The first pads 110 electrically connected to the pogo pins 210 of the pogo module 200 may be larger than the second pads 120 electrically connected to the third pads 510. Areas of the first pads 110 contacting the pogo pins 210 may be larger than areas of the second pads 120 contacting the third pads 510. This may allow the first pads 110 to easily contact the pogo pins 210.

Figure 5A:
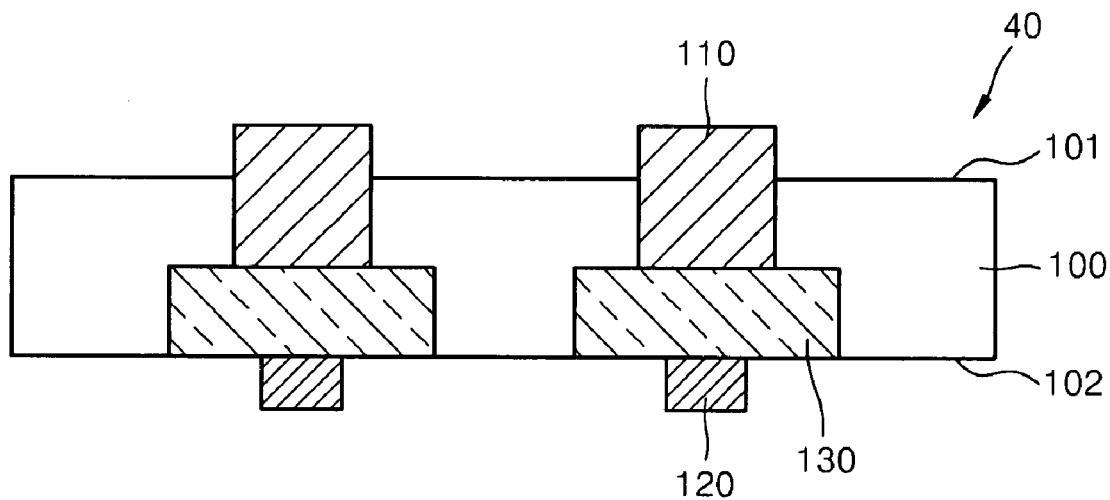
FIGS. 5A and 5B are cross-sectional views illustrating an example embodiment wafer type probe card.
Figure 5B:
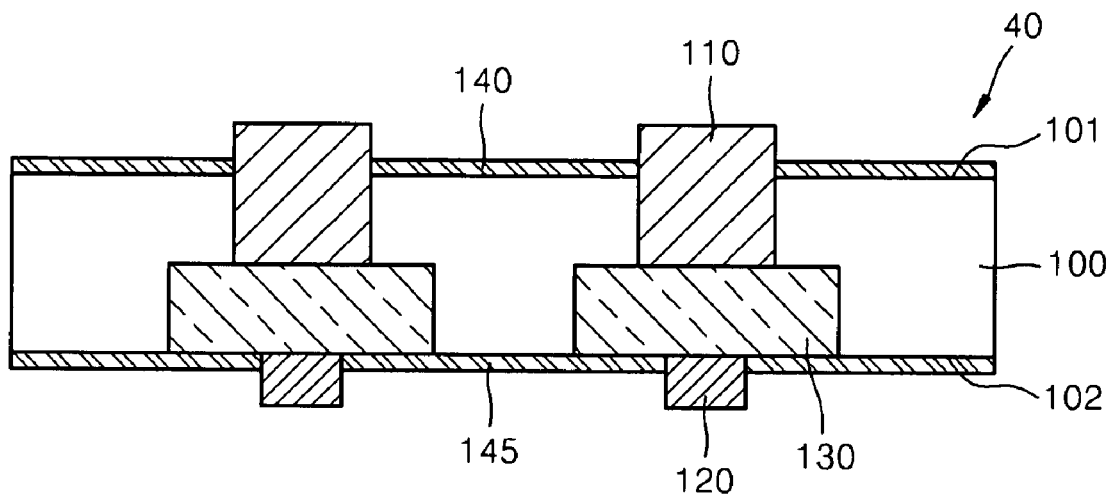

FIGS. 5A and 5B are cross-sectional views illustrating an example embodiment wafer type probe card. FIGS. 5A and 5B are cross-sectional views illustrating one of a plurality of probing chips on a semiconductor substrate 100. As shown in FIGS. 5A and 5B, first pads 110 of a probe card 40 may be arranged in a first surface 101 of a semiconductor substrate 100, and/or second pads 120 may be arranged on a second surface 102 of the semiconductor substrate 100. The first pads 110 may be buried in the first surface 101 of the semiconductor substrate 100 so that a surface of each of the first pads 110 may protrude from the first surface 101. The second pads 120 may be formed on the second surface 102 of the semiconductor substrate 100. Conductive connection wires 130 may be buried in the second surface 102 of the semiconductor substrate 100. Each second pad 120 may be formed on the conductive connection wires 130 so that the second pads 120 may be electrically connected to the first pads 110 by the conductive connection wires 130.

A first insulating layer 140 may be on the first surface 101 of the semiconductor substrate 100 so that a surface of each of the first pads 110 may protrude from the first surface 101 of the semiconductor substrate 100. A second insulating layer 145 may be on the second surface 102 of the semiconductor substrate 100 so that the second pads 120 may protrude from the second surface 102 of the semiconductor substrate 100. Conductive connection wires 130 may be buried in the first surface 101, each first pad 110 may be formed on a conductive connection pad 130, and/or the second pads 120 may be buried in the second surface 102 so that the a surface of each of the second pads 120 may protrude from the second surface 102.

Figure 6A:
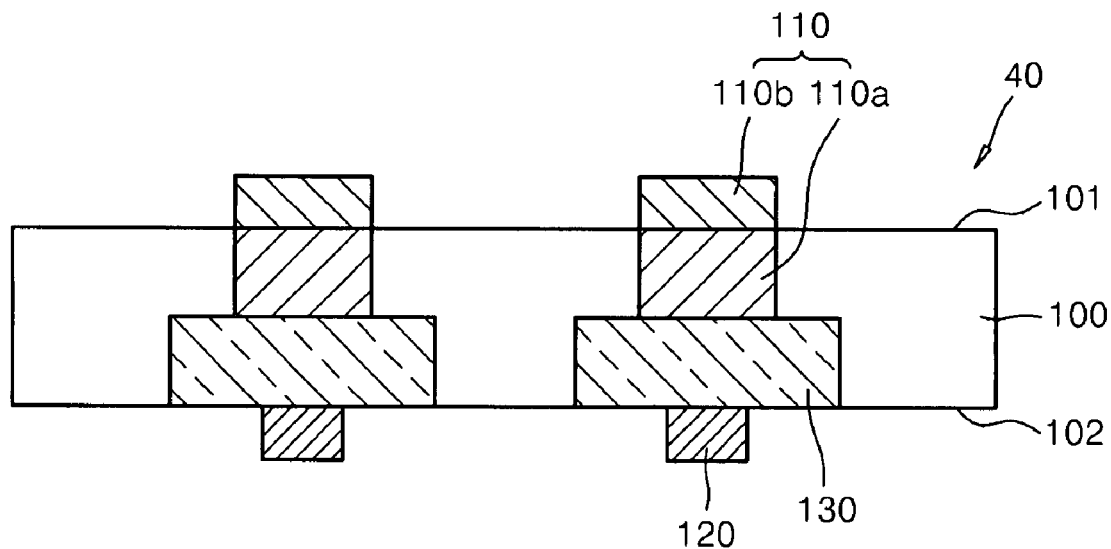
FIGS. 6A and 6B are cross-sectional views illustrating an example embodiment wafer type probe card.
Figure 6B:
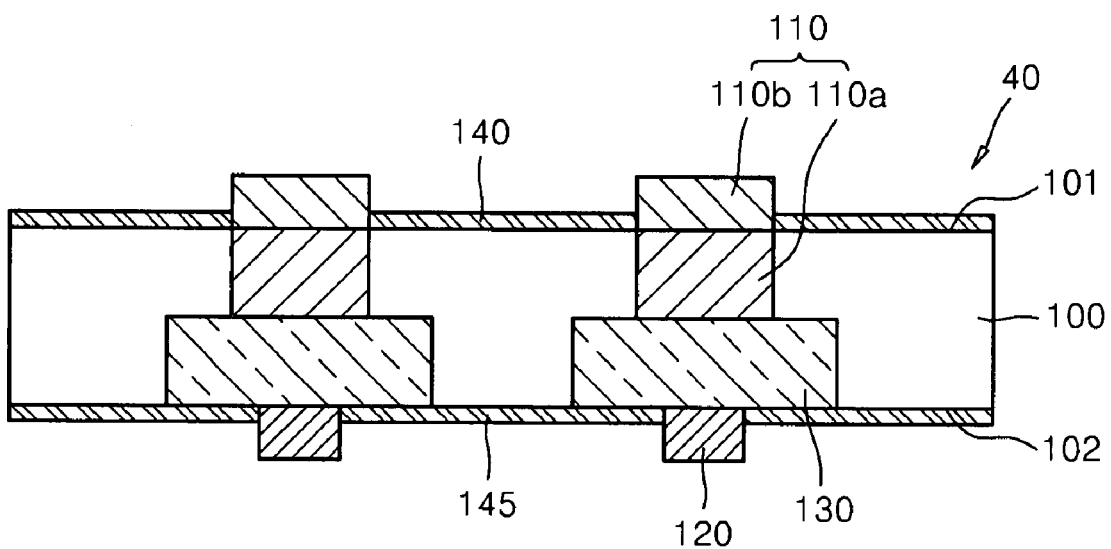

FIGS. 6A and 6B are cross-sectional views illustrating an example embodiment wafer type probe card. FIGS. 6A and 6B are cross-sectional views illustrating one of a plurality of probing chips arranged on a semiconductor substrate 100. As shown in FIGS. 6A and 6B, first pads 110 of a probe card 40 may be arranged in a first surface 101 of the semiconductor substrate 100, and/or second pads 120 may be arranged on a second surface 102. The first pads 110 may include first connection wires 110a buried in the first surface 101 and/or first conductive patterns 110b formed on the first connection wires 110a. The first conductive patterns 110b may be formed on the first surface 101 of the semiconductor substrate 100 so that a surface of the first conductive patterns 110b may protrude from the first surface 101. The second pads 126 may be formed on the second surface 102 of the semiconductor substrate 100 and/or may be electrically connected to the first connection wires 110a of the first pads 110 through conductive connection wires 130 buried in the semiconductor substrate 100.

A first insulating layer 140 may be formed on the first surface 101 of the semiconductor substrate 100 so that the surface of the first conductive patterns 110b of the first pads 110 may protrude from the first surface 101 of the semiconductor substrate 100. A second insulating layer 145 may be formed on the second surface 102 of the semiconductor substrate 100 so that a surface of the second pads 120 may protrude from the second surface 102 of the semiconductor substrate 100. Connection wires 130 may be buried in the first surface 101. The first pads 110 may be formed on the connection wires 130 and/or the second pads 120 may include second connection wires buried in the second surface 102 to be connected to the conductive connection wires 130 and/or second conductive patterns formed on the second connection wires.

Figure 7A:
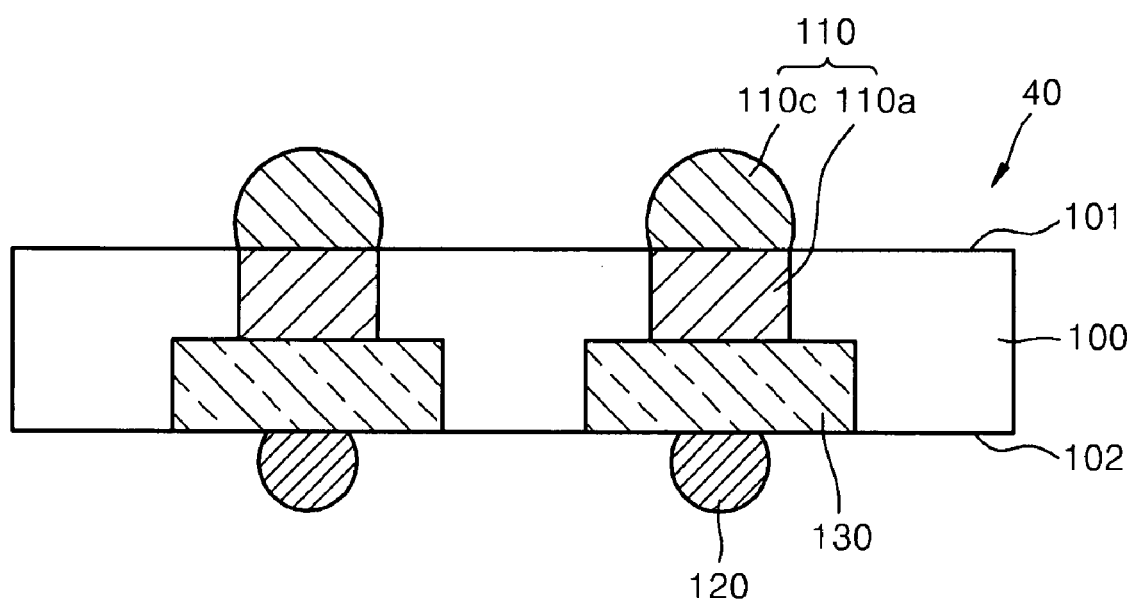
FIGS. 7A and 7B are cross-sectional views illustrating an example embodiment wafer type probe card.
Figure 7B:
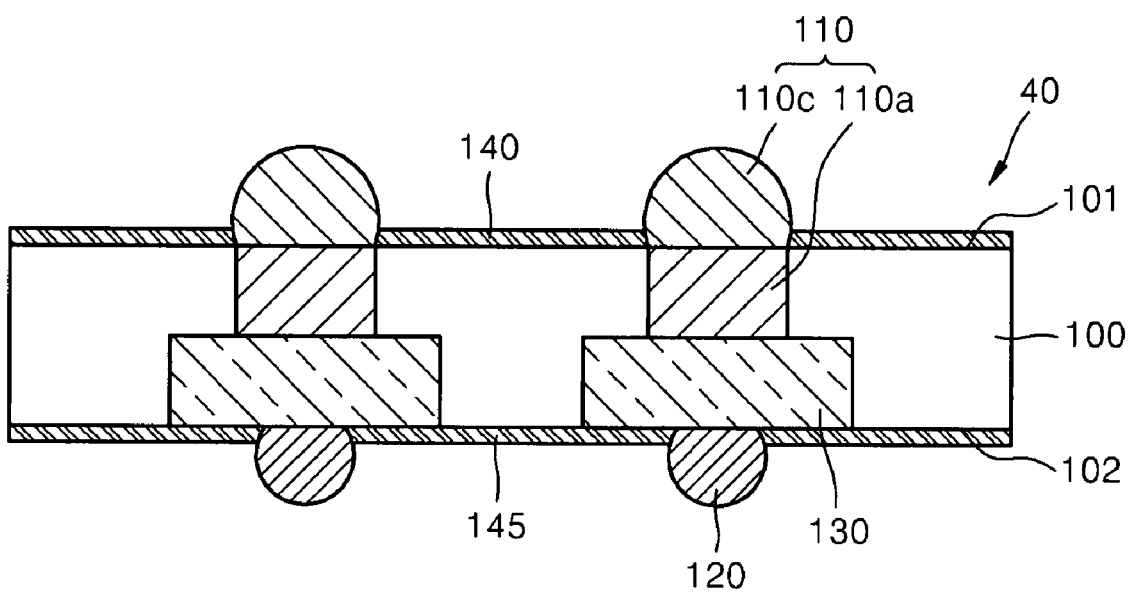

FIGS. 7A and 7B are cross-sectional views illustrating an example embodiment wafer type probe card. FIGS. 7A and 7B are cross-sectional views illustrating one of a plurality of probing chips arranged on a semiconductor substrate. As shown in FIGS. 7A and 7B, first pads 110 of a probe card 40 may be arranged in a first substrate 101 of the semiconductor substrate 100, and second pads 120 may be arranged in a second surface 102. The first pads 110 may include first connection wires 110a buried in the first surface 101 of the semiconductor substrate 100 and/or first conductive balls 110c on the first connection wires 110a. The first conductive balls 110c may be formed on the first surface 101 of the semiconductor substrate 100 so that a surface of each of the first conductive balls 110c may protrude from the first surface 101. Micro-tips may be formed instead of the first conductive balls 110c. The second pads 120 may be formed on the second surface 102 of the semiconductor substrate 100 and/or may be electrically connected to the first connection wires 110a of the first pads 110 through conductive connection wires 130 buried in the second surface 102 of the semiconductor substrate 100.

A first insulating layer 140 may be further formed on the first surface 101 of the semiconductor substrate 100 so that the a surface of each of the first conductive balls 110c may protrude from the first surface 101 of the semiconductor substrate 100. A second insulating layer 145 may be formed on the second surface 102 of the semiconductor substrate 100 so that the second pads 120 may protrude from the second surface 102 of the semiconductor substrate 100. Conductive connection wires 130 may be buried in the first surface 101, first pads 110 may be formed on the conductive connection wires 130, and/or second pads 120 may include second connection wires buried in the second surface 102 to be connected to the conductive connection wires 130 and second conductive balls formed on the second connection wires.

FIGS. 5A through 7B show that the first and second pads 110 and 120 of the probe card 40 are aligned. However, the first and second pads 110 and 120 may be unaligned or may be arranged in various forms so as to be electrically connected to each other.

Figure 8A:
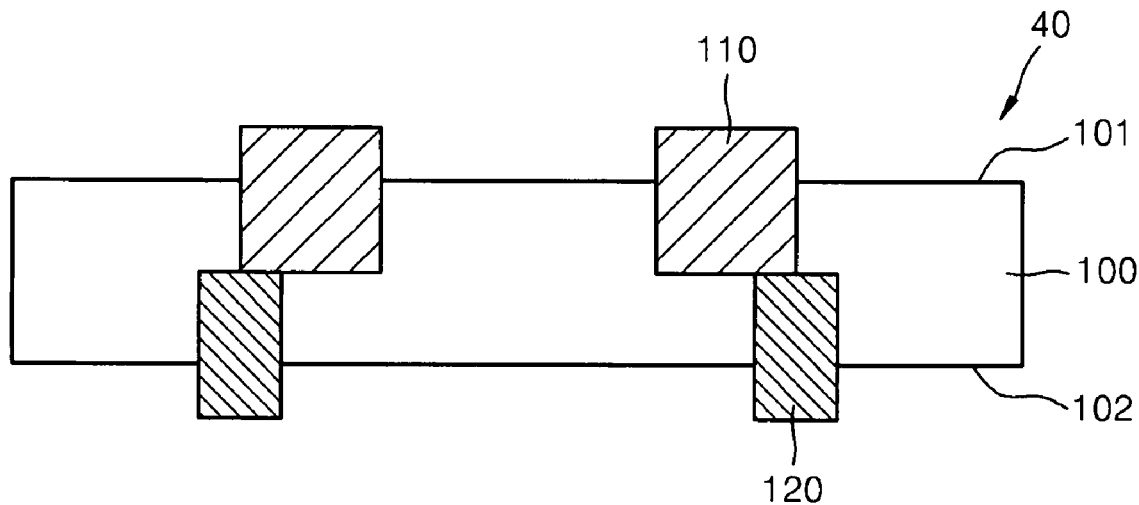
FIGS. 8A and 8B are cross-sectional views illustrating an example embodiment wafer type probe card.
Figure 8B:
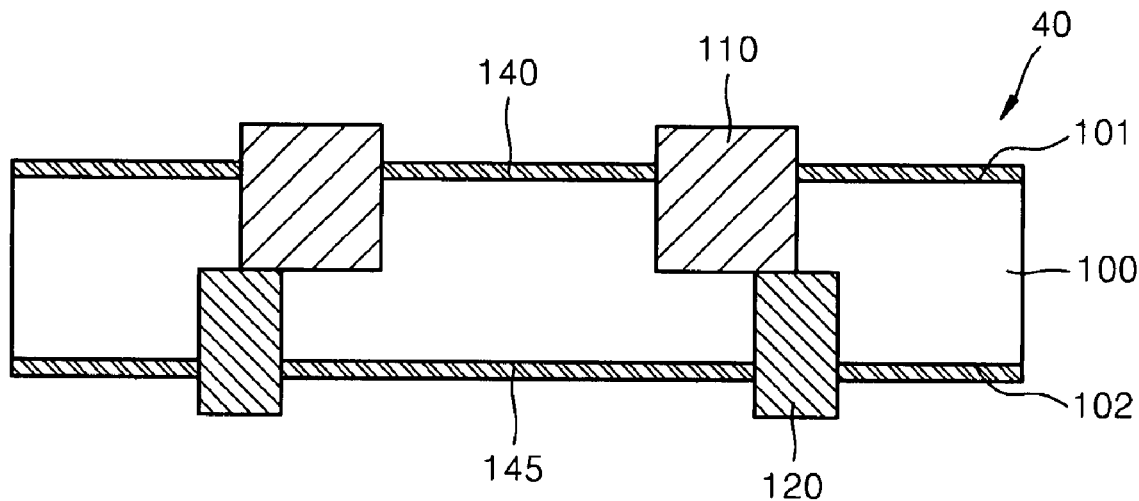

FIGS. 8A and 8B are cross-sectional views illustrating an example embodiment wafer type probe card. FIGS. 8A and 8B are cross-sectional views illustrating one of a plurality of probing chips arranged on a semiconductor substrate. As shown in FIGS. 8A and 8B, first pads 110 of a probe card 40 may be arranged in a first surface 101 of a semiconductor substrate 100, and/or second pads 120 may be arranged in a second surface 102. The first pads 110 may be buried in the first surface 101 so that a surface of the first pads 110 may protrude from the first surface 101. The second pads 120 may be buried in the second surface 102 of the semiconductor substrate 100 so that the second pads 120 may protrude from the second surface 102. Lower surfaces of the first pads 110 may contact lower surfaces of the second pads 120. First pads 110 may be vertically offset from second pads 120 in the semiconductor substrate. Conductive connection wires (not shown) may be buried in the semiconductor substrate 100 to electrically connect the first pads 110 to the second pads 120.

A first insulating layer 140 may be formed on the first surface of the semiconductor substrate 100 so that the surface of each of the first pads 110 may protrude from the first surface of the semiconductor substrate 100. A second insulating layer 145 may be formed on the second surface 102 of the semiconductor substrate 100 so that the second pads 120 may protrude from the second surface 102 of the semiconductor substrate 100.

Figure 9A:
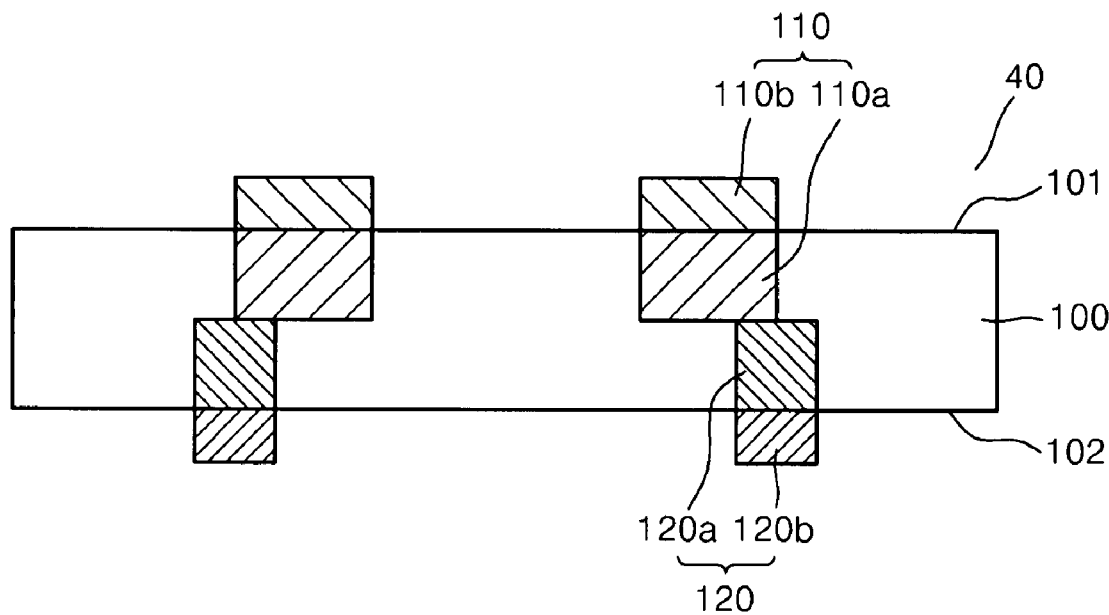
FIGS. 9A and 9B are cross-sectional views illustrating an example embodiment wafer type probe card.
Figure 9B:
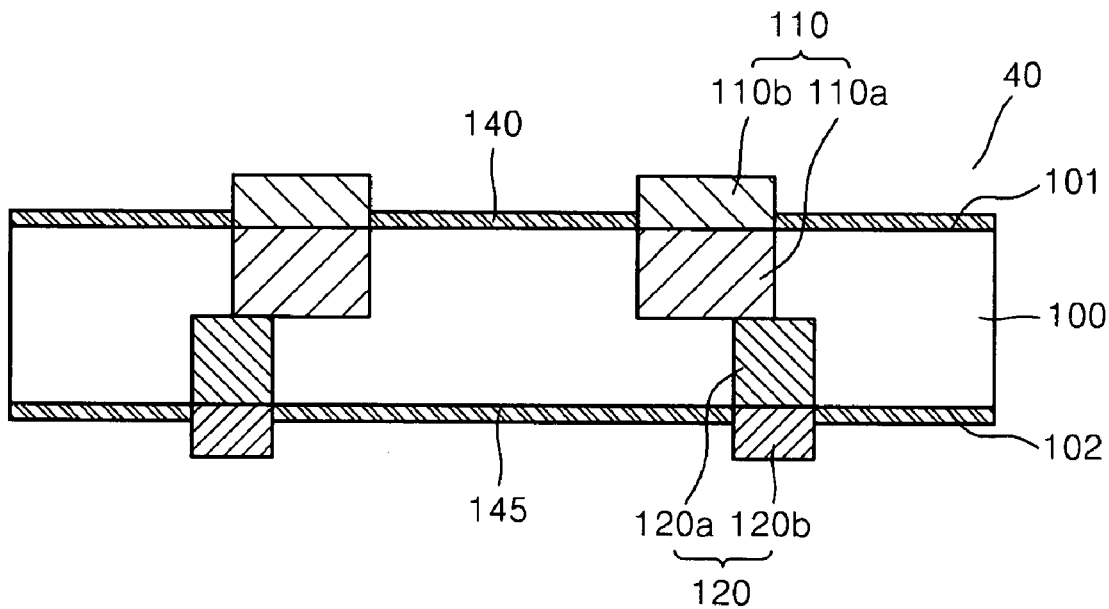

FIGS. 9A and 9B are cross-sectional views illustrating an example embodiment wafer type probe card. FIGS. 9A and 9B are cross-sectional views illustrating one of a plurality of probing chips arranged on a semiconductor substrate. As shown in FIGS. 9A and 9B, first pads 110 of a probe card 40 may be arranged in a first surface 101 of a semiconductor substrate 100, and/or second pads 120 may be arranged in a second surface 102. The first pads 110 may include first connection wires 110a buried in the first surface 101 of the semiconductor substrate 100 and/or first conductive patterns 110b formed on the first connection wires 110a. The first conductive patterns 110b may be formed in the first surface 101 of the semiconductor substrate 100 so that a surface of the first conductive patterns 110b may protrude from the first surface 101. The second pads 120 may include second connection wires 120a buried in the second surface 102 of the semiconductor substrate 100 and/or second conductive patterns 120b formed on the second connection wires 120a. The second conductive patterns 120b may be formed in the second surface 102 of the semiconductor substrate 100 so that the second conductive patterns 120b may protrude from the second surface 102. First pads 110 may be vertically offset from second pads 120 in the semiconductor substrate. The first and second pads 110 and 120 may be electrically connected to each other through the first and second connection wires 110a and 120a.

A first insulating layer 140 may be formed on the first surface 101 of the semiconductor substrate 100 so that a surface of each of the first conductive patterns 110b of the first pads 110 may protrude from the first surface 101 of the semiconductor substrate 100. A second insulating layer 145 may be formed on the second surface 102 of the semiconductor substrate 100 so that the second conductive patterns 120b of the second pads 120 may protrude from the second surface 102 of the semiconductor substrate 100.

Figure 10A:
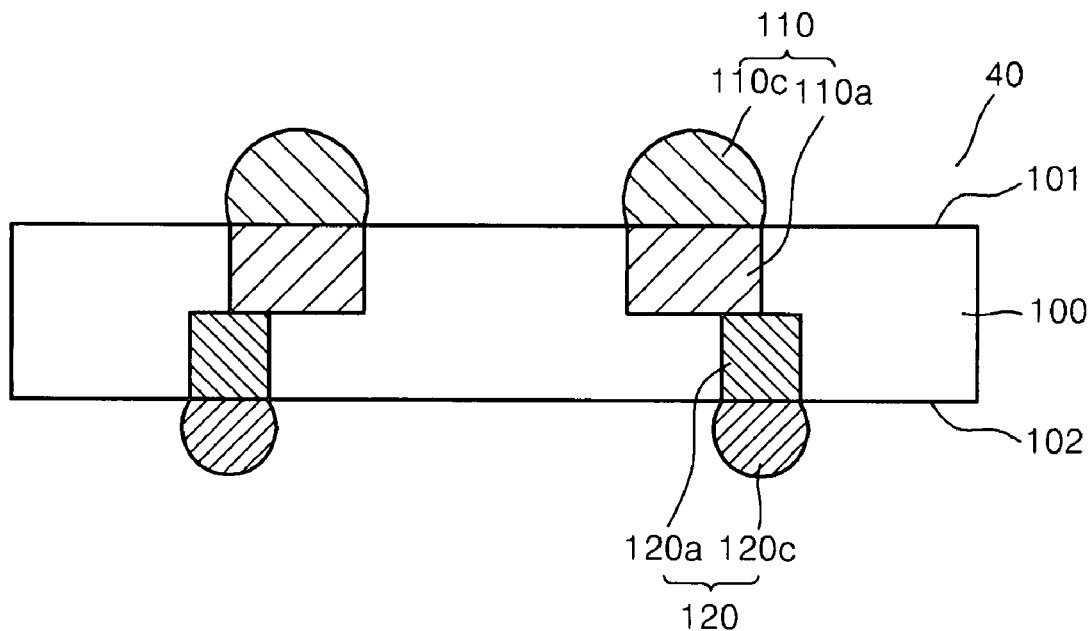
FIGS. 10A and 10B are cross-sectional views illustrating an example embodiment wafer type probe card.
Figure 10B:
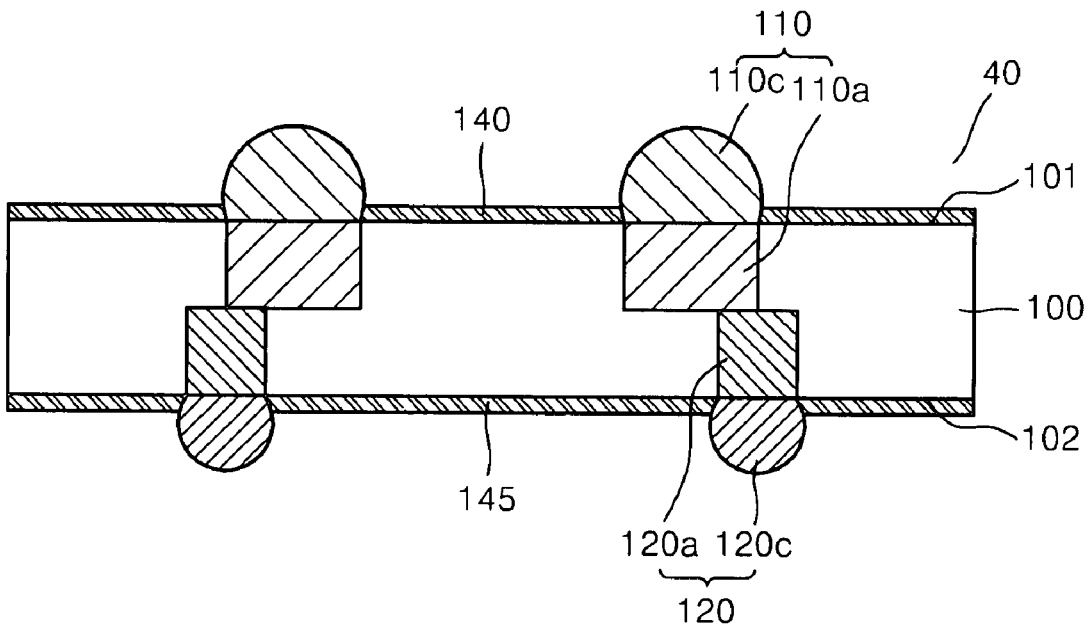

FIGS. 10A and 10B are cross-sectional views illustrating an example embodiment wafer type probe card. FIGS. 10A and 10B are cross-sectional views illustrating one of a plurality of probing chips arranged on a semiconductor substrate. As shown in FIGS. 10A and 10B, first pads 110 of a probe card 40 may be arranged in a first surface 101 of a semiconductor substrate 100, and/or second pads 120 may be arranged in a second surface 102. First pads 110 may be vertically offset from second pads 120 in the semiconductor substrate. The first pads 110 may include first connection wires 110a buried in the first surface 101 of the semiconductor substrate 110 and/or first conductive balls 110c formed on the first connection wires 110a. The first conductive balls 110c may be formed on the first surface 101 of the semiconductor substrate 100 so that a surface of each of the first conductive balls 110c may protrude from the first surface 101. Micro-tips may be formed instead of the first conductive balls 110c. The second pads 120 may include second connection wires 120a buried in the second surface 102 and/or second conductive balls 120c formed on the second connection wires 120a. The second conductive balls 120c may be formed on the second surface 102 of the semiconductor substrate 100 so that the second conductive balls 120c may protrude from the second surface 102. Micro-tips may be formed instead of the second conductive balls 120c. The first and second pads 110 and 120 may be electrically connected to each other through the first and second connection wires 110a and 120a.

A first insulating layer 140 may be formed on the first surface 101 of the semiconductor substrate 100 so that the a surface of each of the first conductive balls 110c of the first pads 110 may protrude from the first surface of the semiconductor substrate 100. A second insulating layer 145 may be formed on the second surface 102 of the semiconductor substrate 100 so that the second conductive balls 120c of the second pads 120 may protrude from the second surface 102 of the semiconductor substrate 100.

Figure 11A:
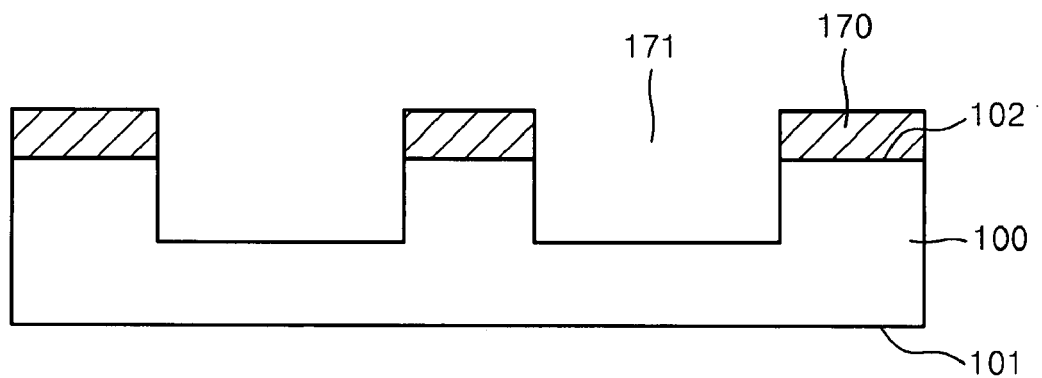
FIGS. 11A through 11E are cross-sectional views illustrating an example embodiment method for fabricating a wafer type probe card.

FIGS. 11A through 11E are cross-sectional views illustrating an example embodiment method for fabricating a wafer type probe card. As shown in FIG. 11A, a first mask pattern 170 having openings may be formed on a second surface 102 of a semiconductor substrate 100. Openings in the first mask pattern 170 may expose portions of the second surface 102 of the semiconductor substrate 100. The first mask pattern 170 may be a photosensitive pattern, insulating layer patterns, and/or another suitable pattern material. The exposed portions of the second surface 102 may be etched using the first mask pattern 170 to form first grooves 171.

Figure 11B:
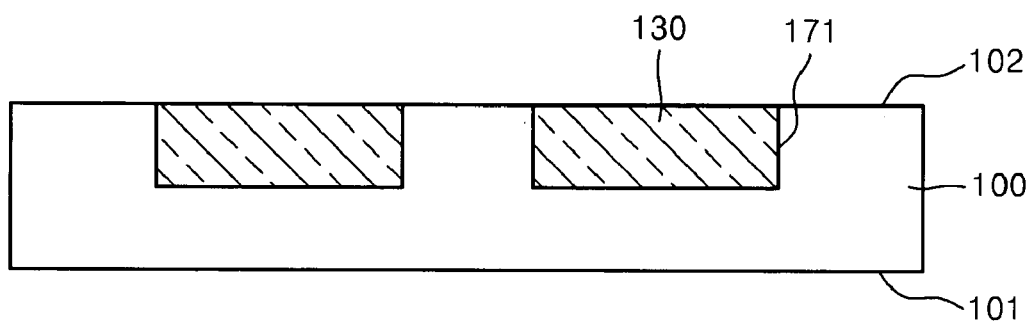

As shown in FIG. 11B, the first mask pattern 170 may be removed. Connection wires may be formed of a first metallic material in the first grooves 171 formed in the second surface 102 using, for example, a damascene process. The connection wires 130 may be buried in the second surface 102. Alternatively, the first mask pattern 170 may be removed after the connection wires 130 are formed. There, the connection wires 130 may be formed using, for example, a photolithographic process.

Figure 11C:
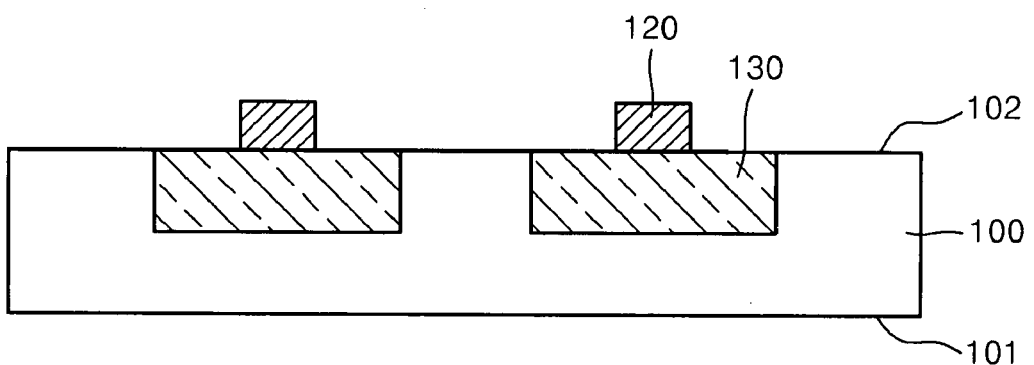

As shown in FIG. 11C, an insulating pattern (not shown) may be formed on the connection wires 130 to expose portions of the connection wires 130, and second pads 120 may be formed of a second metallic material on the exposed portions of the connection wires 130 using, for example, a damascene process. The insulating pattern may be removed so that the second pads 120 may protrude from the second surface 102. The second insulating layer 145 of FIG. 5B may be formed on the second surface 102 before the second pads 120 are formed. The second insulating layer 145 may be deposited on the connection wires 130 and the second surface 102 and then patterned using, for example, mask patterns (not shown) to expose the portions of the connection wires 130 on which the second pads 120 are formed. The second pads 120 may be formed on the exposed portions of the connection wires 130 using, for example, a damascene process. The second pads 120 may be formed using, for example, a photolithographic process.

Figure 11D:
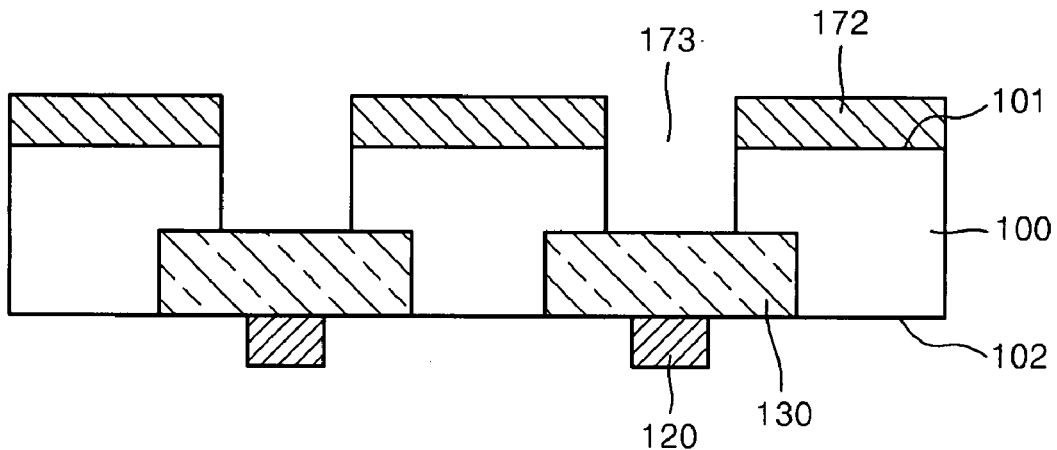

As shown in FIG. 11D, a second mask pattern 172 having openings may be formed on a first surface 101 of the semiconductor substrate 100, wherein the openings may expose portions of the first surface 101. The second mask pattern 172 may be a photosensitive pattern, insulating layer patterns, and/or another suitable pattern material. The exposed portions of the first surface 101 may be etched using the second mask pattern 172 to form second grooves 173. The second grooves 173 may be formed to expose portions of the connection wires 130.

Figure 11E:
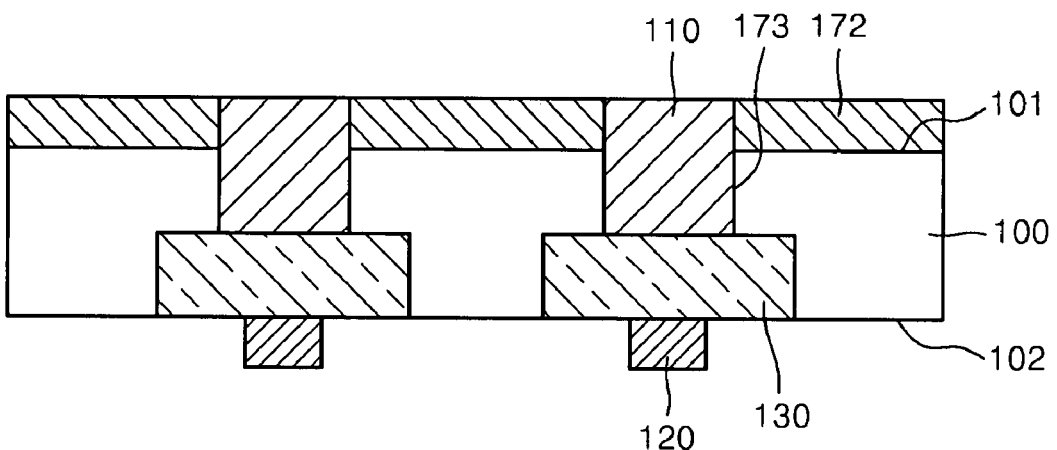

As shown in FIG. 11E, first pads 110 may be formed of a third metallic material in the second grooves 173 and the openings of the second mask pattern 172 using, for example, a damascene process. The second mask pattern 172 may be removed so that the first pads 110 may protrude from the first surface 101. The first insulating layer 140 of FIG. 5B may be formed on the first surface before the first pads 110 are formed. The first insulating layer 140 may be deposited on the first surface 101, and the second mask pattern 172 may be formed on the first insulating layer 140. The first insulating layer 140 and/or the first surface 101 may be etched using the second mask pattern 172 to form the second grooves 173. The first pads 110 may be formed in the second grooves 173 using, for example, a damascene process, and the second mask pattern 172 may be removed. The first pads 110 may be formed using a photolithographic process. The first through third metal materials may be formed of the same material or different materials.

Figure 12A:
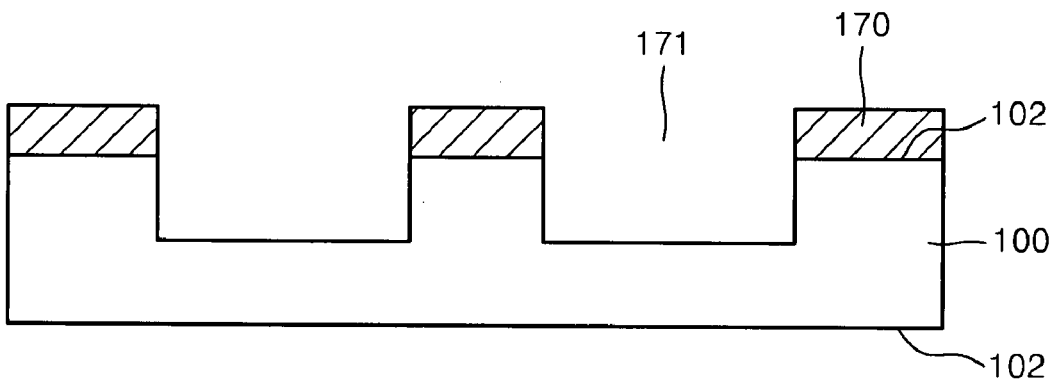
FIGS. 12A through 12E are cross-sectional views illustrating an example embodiment method for fabricating a wafer type probe card.
Figure 12B:
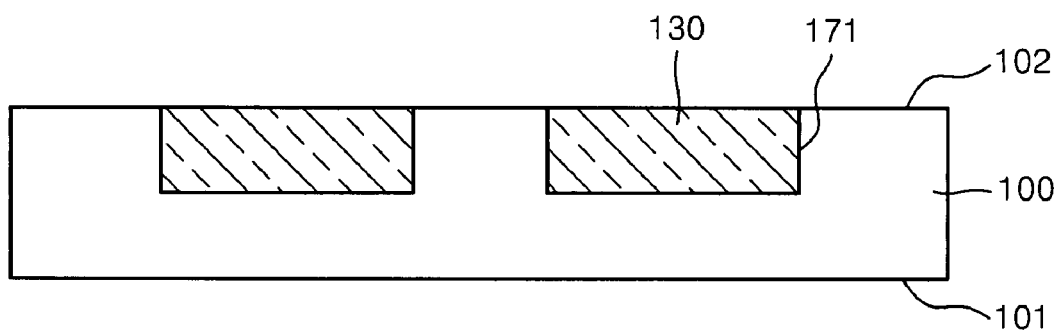
Figure 12C:
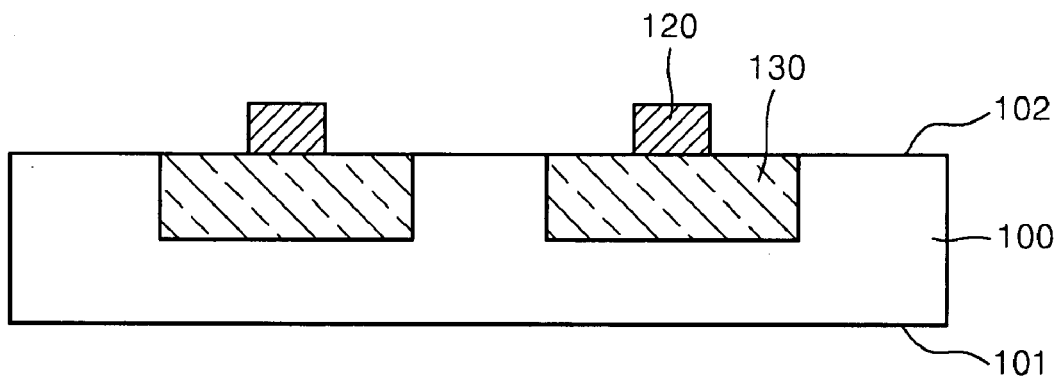
Figure 12D:
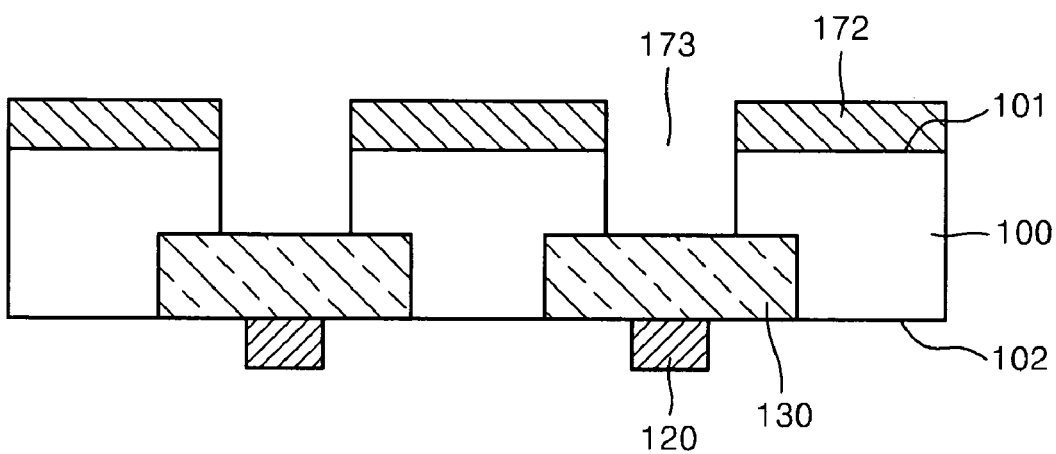
Figure 12E:
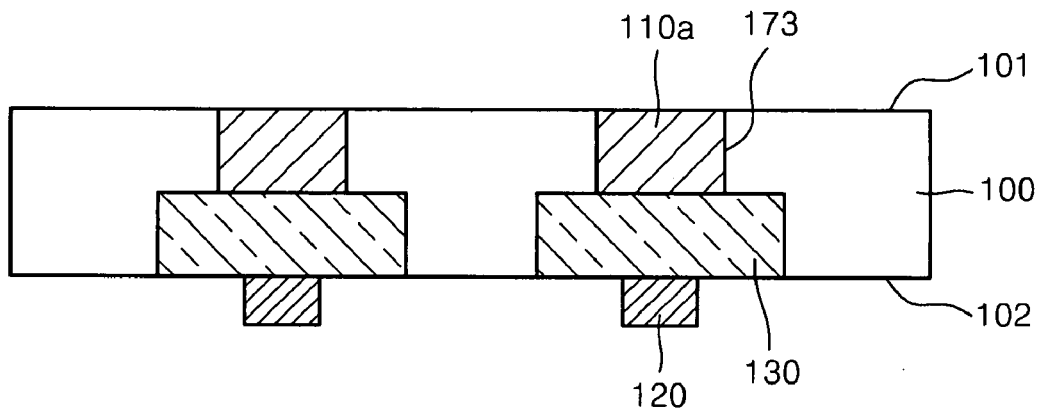

FIGS. 12A through 12E are cross-sectional views illustrating an example embodiment method for fabricating a wafer type probe card. Example embodiment processes of fabricating a probe card illustrated in FIGS. 12A through 12D may be the same as those described in FIGS. 11A through 11D, and redundant portions may be omitted herein. As shown in FIG. 12E, a second mask pattern 172 may be removed, and first connection wires 110a may be formed in first grooves 171 to be buried in the first surface 101 using, for example, a damascene process. First conductive patterns 10B as shown in FIGS. 6A and 6B may be formed on the first connection wires 110a to form first pads 110 that may include the first connection wire 110a and/or the first conductive pattern 110b. The first connection wires 110 may be formed of the same material or a different material from the first conductive patterns 110b.

Figure 13A:
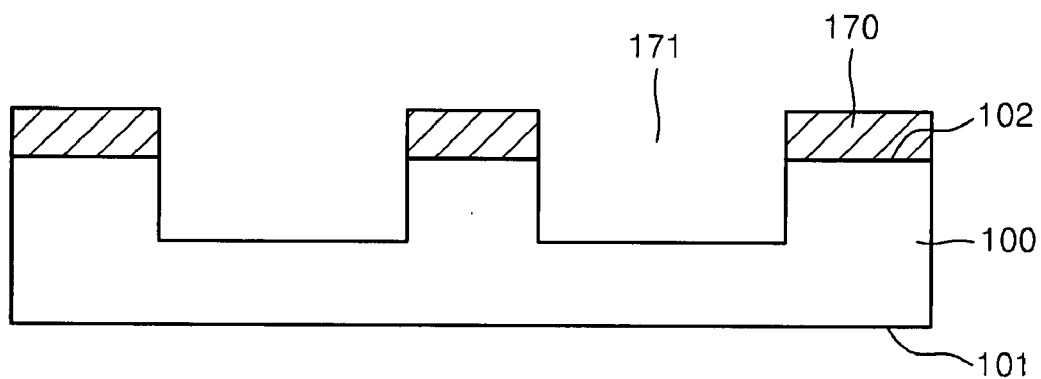
FIGS. 13A through 13D are cross-sectional views illustrating an example embodiment method for fabricating a wafer type probe card.
Figure 13B:
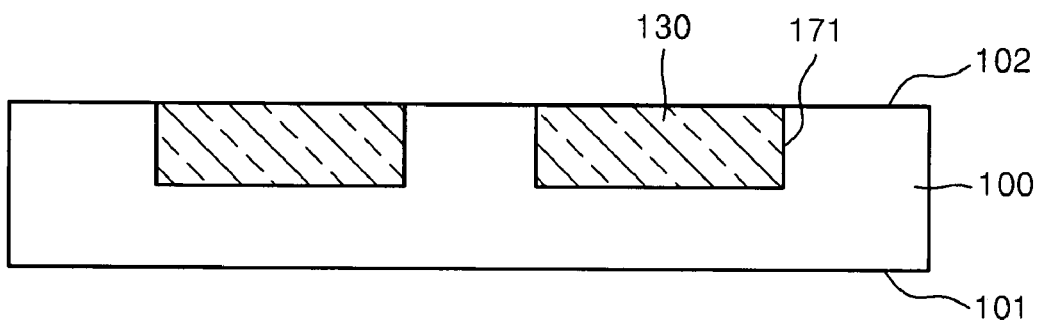
Figure 13C:
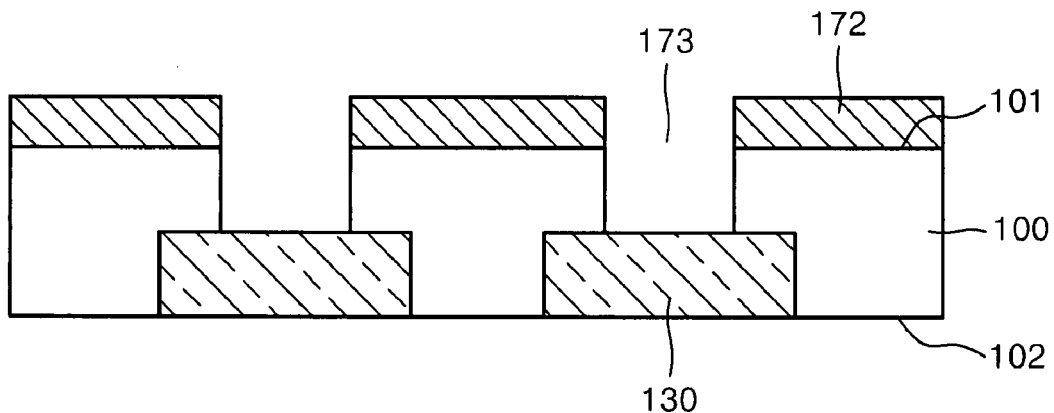

FIGS. 13A through 13D are cross-sectional views illustrating an example embodiment method for fabricating a wafer type probe card. Example embodiment processes of fabricating the probe card illustrated in FIGS. 13A through 13B are the same as those described with reference to FIGS. 11A and 11B, and redundant portions may be omitted herein. As shown in FIG. 13C, a first mask pattern 170 having openings may be formed on a first surface 101 of a semiconductor substrate 100, wherein the openings may expose portions of the first surface 101. The exposed portions of the first surface 101 may be etched using the first mask patterns 170 to form first grooves 171. The first grooves 171 may be formed to expose at least portions of connection wires 130.

Figure 13D:
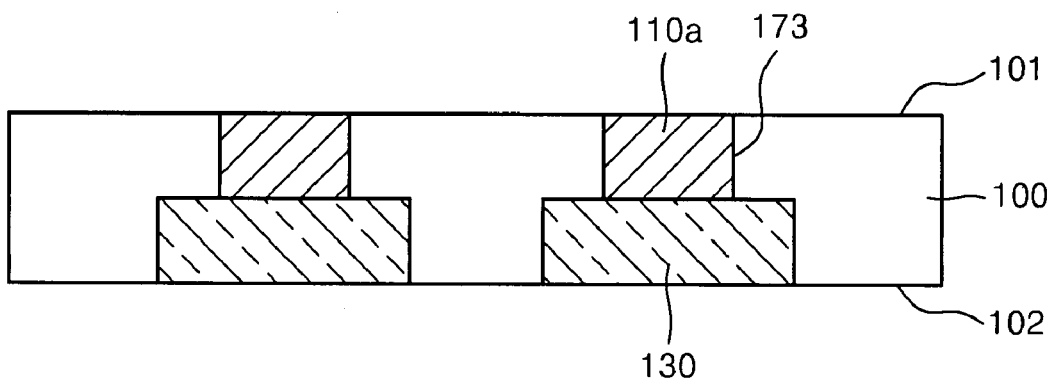

As shown in FIG. 13D, the first mask pattern 170 may be removed, and then first connection patterns 110a may be formed in the first grooves 171 using, for example, a damascene process to be buried in the first surface 101. First conductive balls 110c as shown in FIGS. 7A and 7B may be formed on the first connection wires 110a to form first pads 110 that may include the first connection wire 110a and the first conductive ball 110c. Second pads 120 having a conductive ball shape may be formed on the connection wires 130. Micro-tips may be formed instead of the first conductive balls 110c.

Figure 14A:
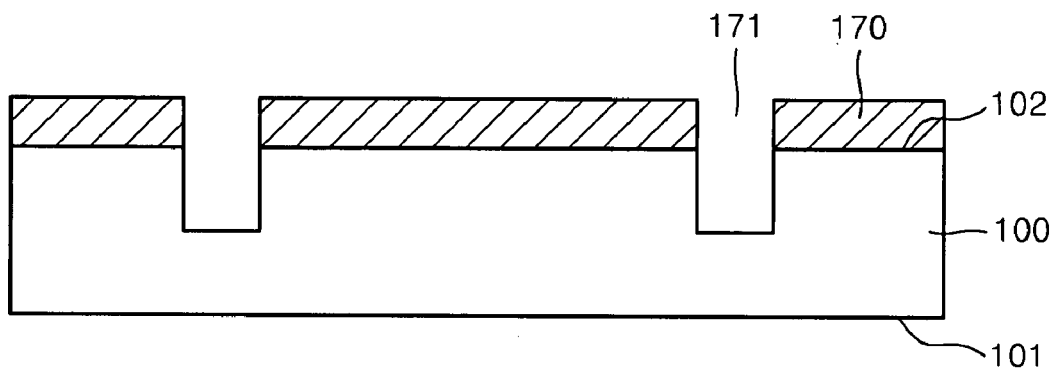
FIGS. 14A through 14D are cross-sectional views illustrating an example embodiment method for fabricating a wafer type probe card.

FIGS. 14A through 14D are cross-sectional views illustrating an example embodiment method for fabricating a wafer type probe card. As shown in FIG. 14A, first mask pattern 170 having openings may be formed on a second surface 102 of a semiconductor substrate 100, wherein the openings may expose portions of the second surface 102 of the semiconductor substrate 100. The first mask pattern 170 may be photosensitive pattern, insulating layer patterns, and/or another suitable patterning material. The exposed portions of the second surface of the semiconductor substrate 100 may be etched using the first mask pattern 170 to form first grooves 171.

Figure 14B:
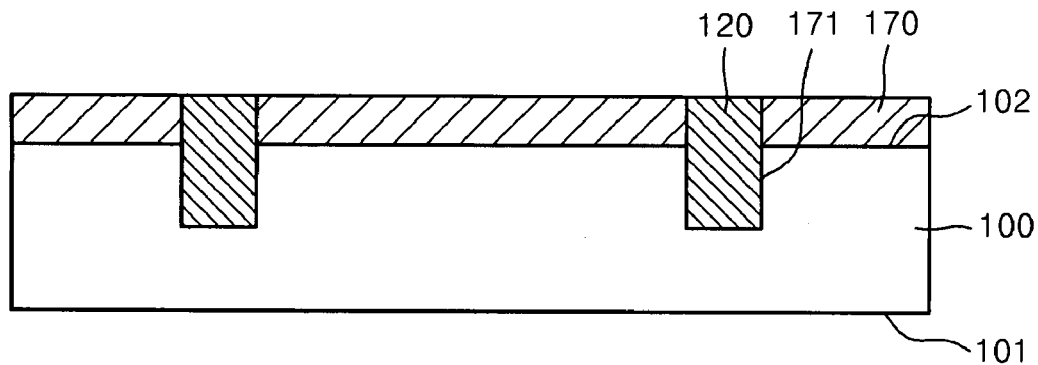

As shown in FIG. 14B, second pads 120 may be formed of a second metal material in the first grooves 171 and the openings of the first mask pattern 170 formed in the second surface 102 using, for example a damascene process. The first mask pattern may be removed so that the second pads 120 may protrude from the second surface 102. Alternatively, the second pads 120 may be formed using, for example, a photolithographic process. A second insulating layer 145 as shown in FIG. 8B may be formed on the second surface 102. The second insulating layer 145 may be deposited on the second surface 102, and the second insulating layer 145 and/or the portions of the second surface 102 may be etched using the first mask pattern 170 to form the first grooves 171. Second pads 120 may be formed in the first grooves 171 and/or the openings of the first mask pattern 170 using, for example, a damascene process. The second pads 120 may be formed using a photolithographic process.

Figure 14C:
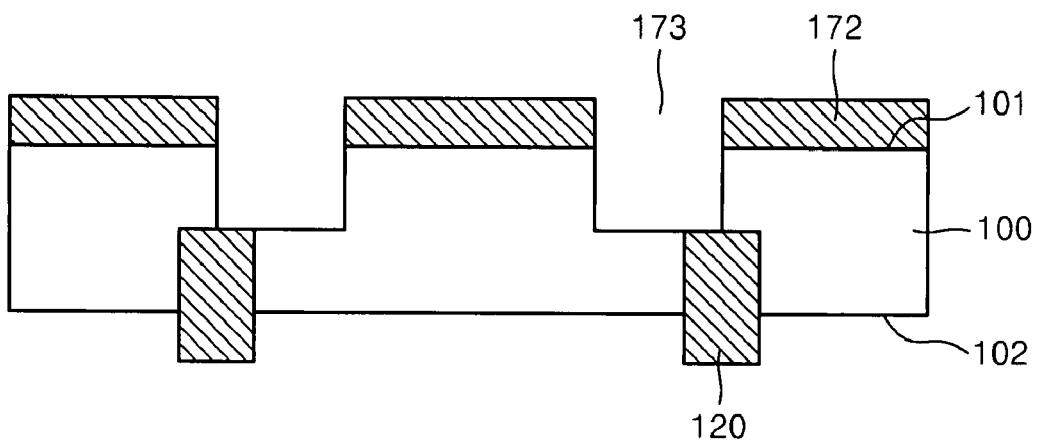

As shown in FIG. 14C, a second mask pattern 172 having openings may be formed on a first surface 101 of the semiconductor substrate, wherein the openings may expose portions of the first surface 101. The exposed portions of the first surface 101 may be etched using the second mask pattern 172 to form second grooves 173. The second grooves 173 may be formed to expose portions of the second pads 120.

Figure 14D:
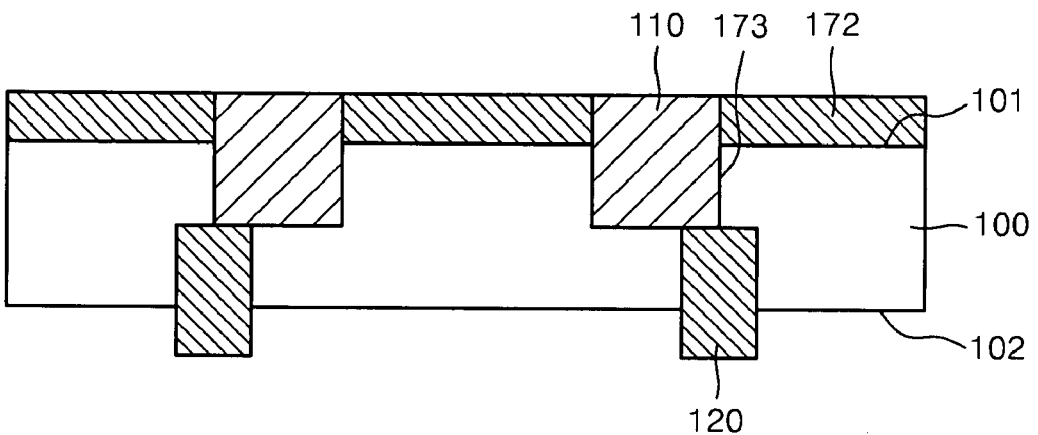

As shown in FIG. 14D, first pads 110 may be formed in the fsecond grooves 173 and the openings of the second mask pattern 184 using, for example, a damascene process. The second mask pattern 172 may be removed so that the first patterns 110 may protrude from the first surface 101. A first insulating layer 140 as shown in FIG. 8B may be formed on the first surface 101. The first insulating layer 140 may be deposited on the first surface 101, and the second mask patterns 172 may be formed on the first insulating layer 140. The first insulating layer 140 (not shown) and portions of the first surface 101 may be etched using the second mask pattern 184 to form the second grooves 173. The first pads 110 may be formed in the second grooves 173 and the openings of the second mask patterns 172 using, for example, a damascene process, and the second mask patterns 172 may be removed. The first pads 110 may be formed using, for example, a photolithographic process.

Figure 15A:
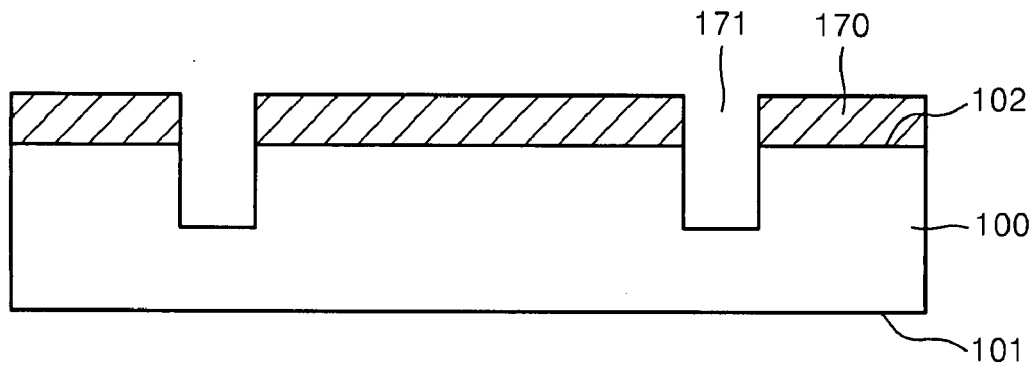
FIGS. 15A through 15E are cross-sectional views illustrating an example embodiment method for fabricating a wafer type probe card.
Figure 15B:
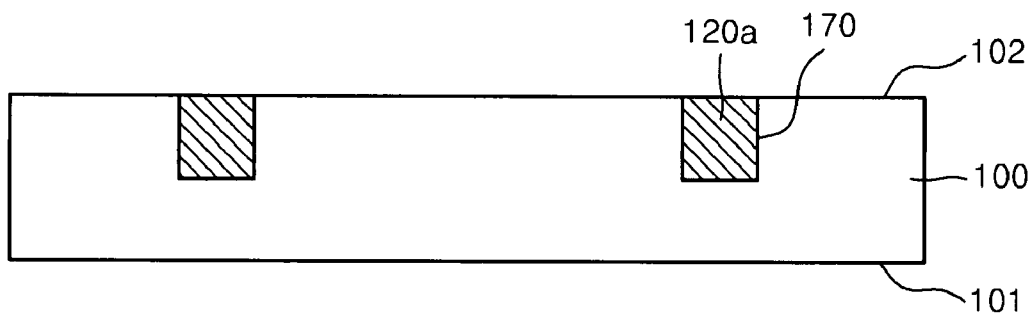

FIGS. 15A through 15E are cross-sectional views illustrating an example embodiment method for fabricating a wafer type probe card. As shown in FIG. 15A, a first mask pattern 186 having openings may be formed on a second surface 102 of a semiconductor substrate 100, wherein the openings may expose portions of the second surface 102 of the semiconductor substrate 100. The exposed portions of the second surface 102 of the semiconductor substrate 100 may be etched using the first mask pattern 186 to form first grooves 171. As shown in FIG. 15B, the first mask pattern 170 may be removed, and second connection wires 120a may be formed in the first grooves 171 using, for example, a damascene process. The second connection wires 120a may be formed using, for example, a photolithographic process.

Figure 15C:
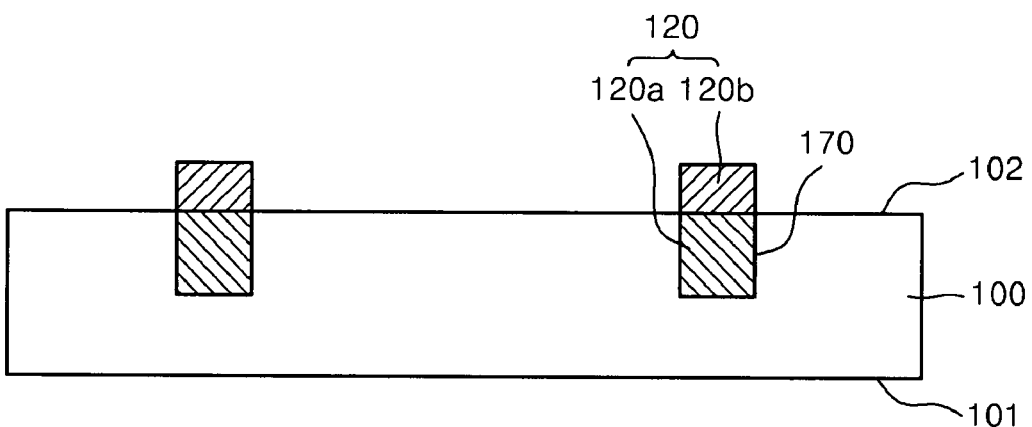

As shown in FIG. 15C, second conductive patterns 120b may be formed on the second connection wires 120a to form second pads 120 that may include the second connection wires 120a and second conductive patterns 120b. The second connection wires 120a and the second conductive patterns 120b may be formed of the same material or different materials. A second insulating layer 145 as shown in FIG. 8B may be formed on the second surface 102. The second insulating layer 145 may be deposited on the second surface 102 and etched using a mask pattern (not shown) to form grooves, and the second conductive patterns 120b may be formed in the grooves using, for example, a damascene process. The second conductive patterns 120b of the second pads 120 may be formed using, for example, a photolithographic process.

Figure 15D:
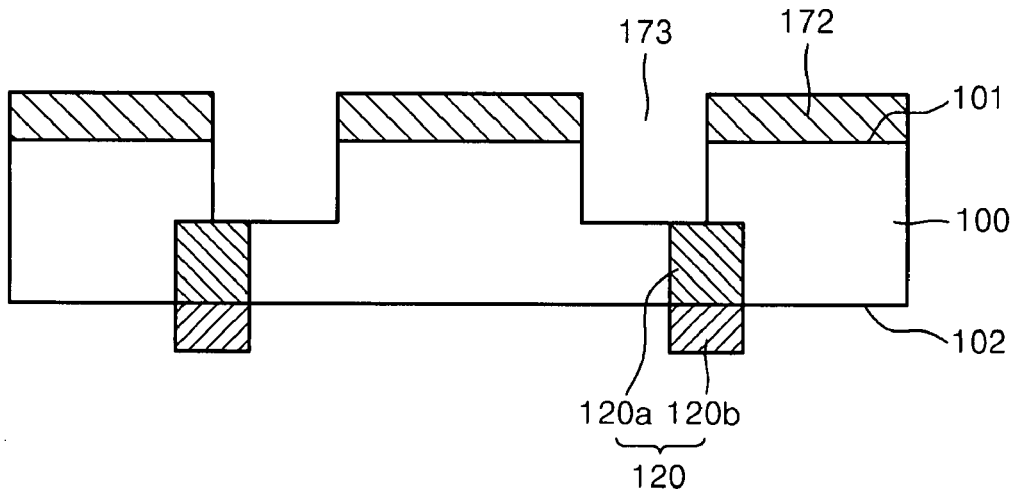

As shown in FIG. 15D, a second mask pattern 172 having openings may be formed on the first surface 101 of the semiconductor substrate 100, wherein openings may expose portions of the first surface 101. Exposed portions of the first surface 101 may be etched using the second mask patterns 188 to form second grooves 173. The second grooves 173 may be formed to expose at least portions of the second conductive wires 120a of the second pads 120.

Figure 15E:
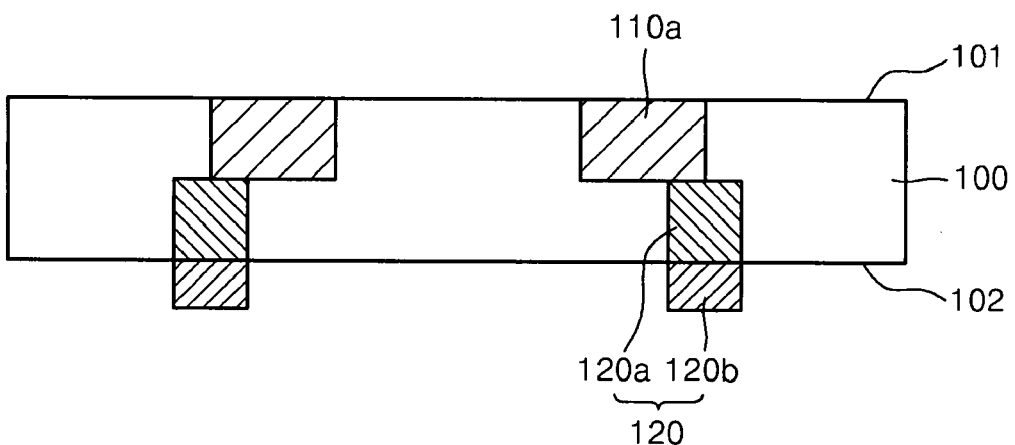

As shown in FIG. 15E, the second mask pattern 172 may be removed, and first connection wires 110a may be formed in the first grooves 171 using, for example, a damascene process. First conductive patterns 110b as shown in FIG. 9 may be formed on the first connection wires 110a to form the first pads 110 including the first connection wires 110a and/or the first conductive patterns 110b. The first connection wires 110a and/or the first conductive patterns 110b of the first pads 110 may be formed of the same material or different materials. The first pads 110 may be formed of the same material as or a different material from the second pads 120. A first insulating layer 140 as shown in FIG. 9B may be formed on the first surface 101. The first insulating layer 140 may be deposited on the first surface 101 and then etched using a mask pattern (not shown) to form first grooves, and the first conductive pads 110b of the first pads 110 may be formed in the grooves using, for example, a damascene process. The mask pattern may be removed so that the first conductive patterns 110b of the first pads 110 may protrude from an upper surface of the first insulating layer 140. The first conductive patterns 110b of the first pads 110 may be formed using, for example, a photolithographic method.

Figure 16A:
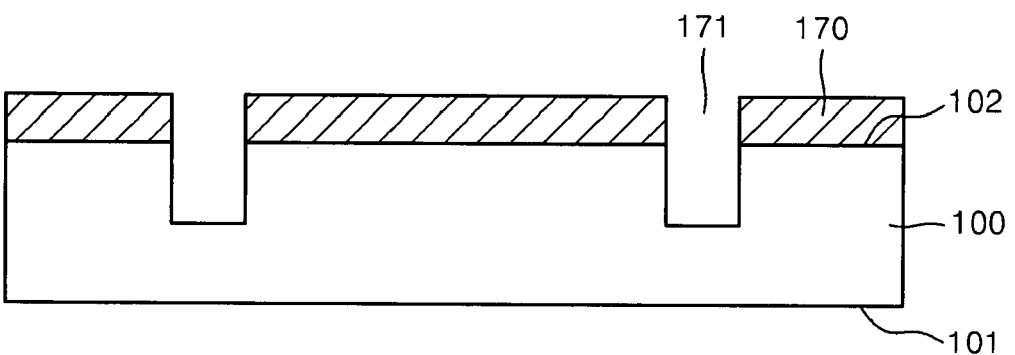
FIGS. 16A through 16D are cross-sectional views illustrating an example embodiment method for fabricating a wafer type probe card.
Figure 16B:
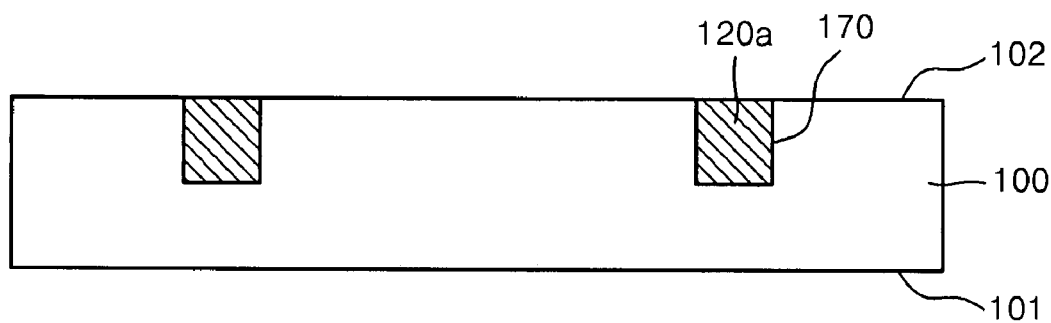
Figure 16C:
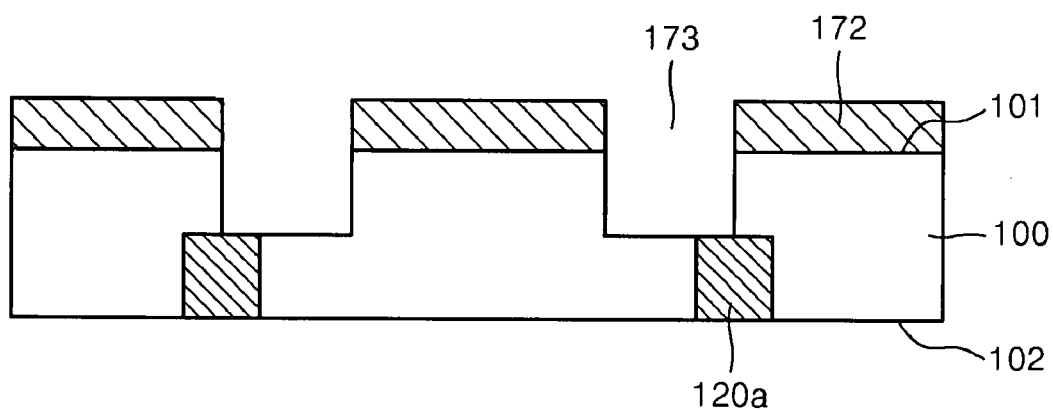

FIGS. 16A through 16D are cross-sectional views illustrating an example embodiment method for fabricating a wafer type probe card. Example embodiment processes of fabricating the probe card illustrated in FIGS. 16A and 16B may be similar to those described with reference to FIGS. 15A and 15B, and redundant portions may be omitted herein. As shown in FIG. 16C, second mask patterns 172 having openings may be formed on a first surface 101 of a semiconductor substrate 100, wherein the openings may expose portions of the first surface 101. The first surface 101 may be etched using the second mask patterns 172 to form second grooves 173. The second grooves 173 may be formed to expose at least portions of second connection wires 120a of second pads 120.

Figure 16D:
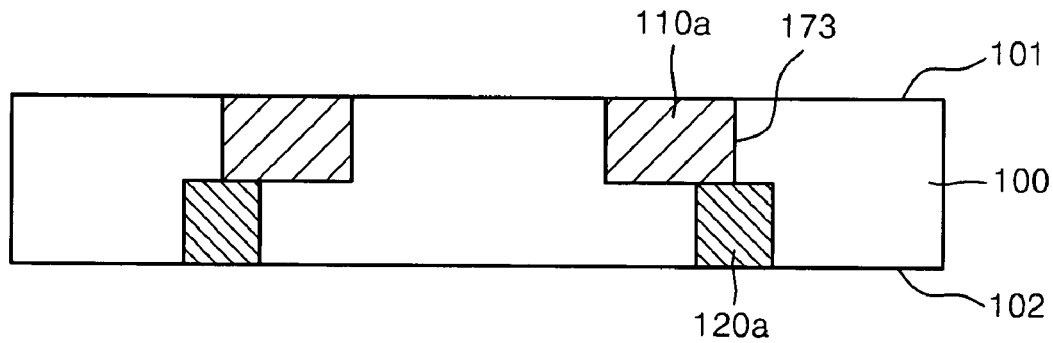

As shown in FIG. 16D, the second mask patterns 172 may be removed, and first connection wires 110a may be formed in the second grooves 173 using, for example, a damascene process to be buried in the first surface 101. The first connection wires 110 may be formed of the same material as or a different material from the second connection wires 120a. First conductive balls 110c as shown in FIGS. 10A and 10B may be formed on the first connection wires 110a to form first pads 110 including the first connection wires 110a and the first conductive balls 110c. Second conductive balls 120c as shown in FIGS. 10A and 10B may be formed on the second connection wires 120a to form the second pads 120 including the second connection wires 120a and the second conductive balls 120c. Micro-tips may be formed instead of the first and second conductive balls 110c and 120c.

In an example embodiment method of fabricating a probe card, the first pads 110 may be formed on the first surface 101 of the semiconductor substrate 100, and the second pads 120 may be formed on the second surface 120.

While example embodiments have been particularly shown and described, it will be understood by those of ordinary skill in the art that various changes in form and details may be made therein without departing from the spirit and scope of the invention.

What is claimed is:

1. A wafer type probe card comprising:
   a semiconductor substrate; and
   a plurality of probing areas on the semiconductor substrate, each of the probing areas corresponding to a chip for testing on a separate substrate, each of the probing areas having a first surface and a second surface, the first surface opposite the second surface, the first surface including a plurality of first grooves and a plurality of first conductive pads formed in the plurality of first grooves to protrude from the first surface, and the second surface including a plurality of second grooves exposing portions of the plurality of first conductive pads and a plurality of second conductive pads formed in the plurality of second grooves to protrude from the second surface, the exposed portions of each of the first conductive pads being electrically directly connected to a corresponding second conductive pad.

2. The wafer type probe card of claim 1, wherein each of the probing areas is configured to simultaneously probe the corresponding chip arranged on the separate substrate so that the probe card simultaneously probes a plurality of the corresponding chips.

3. The wafer type probe card of claim 1, wherein one pad of the first conductive pads and the second conductive pads contacts third pads on the corresponding chip.

4. The wafer type probe card of claim 3, wherein the one pad of the first conductive pads and the second conductive pads respectively contacting the third pads is a different size than other pads not contacting the third pads.

5. The wafer type probe card of claim 1, wherein
the first conductive pads include a plurality of first conductive connection wires in the plurality of first grooves in the first surface of the semiconductor substrate and a plurality of first conductive patterns on the first connection wires, the first conductive patterns protruding from the first surface of the semiconductor substrate,
the second conductive pads includes a plurality of conductive second connection wires in the plurality of second grooves in the second surface of the semiconductor substrate and a plurality of second conductive patterns on the second connection wires, the second conductive patterns protruding from the second surface of the semiconductor substrate, and
the first connection wires are electrically directly connected to the second connection wires.

6. The wafer type probe card of claim 1, wherein
the first conductive pads include a plurality of first conductive connection wires in the plurality of first grooves in the first surface of the semiconductor substrate and a plurality of first conductive balls on the first connection wires, the first conductive balls protruding from the first surface of the semiconductor substrate,
the second conductive pads include a plurality of second conductive connection wires in the plurality of second grooves in the second surface of the semiconductor substrate and a plurality of second conductive balls on the second connection wires, the second conductive balls protruding from the second surface of the semiconductor substrate, and
the first connection wires are electrically connected directly to the second connection wires.

7. A semiconductor test apparatus, comprising:
a test head including a performance board with a plurality of signal pads, the test head configured to apply test signals to the plurality of signal pads of the performance board to test the electrical properties of a plurality of semiconductor chips;
a wafer type probe card including a semiconductor substrate and a plurality of probing areas, at least one of the probing areas including a first surface and a second surface opposite to the first surface, the first surface including a plurality of first grooves and a plurality of first conductive pads formed in the plurality of first grooves to protrude from the first surface, and the second surface including a plurality of second grooves exposing portions of the plurality of first conductive pads and a plurality of second conductive pads formed in the plurality of second grooves to protrude from the second surface, the exposed portions of each of the first conductive pads being electrically directly connected to a corresponding second conductive pads; and
a pogo module contacting the plurality of signal pads and the plurality of first conductive pads.

8. The semiconductor test apparatus of claim 7, wherein the plurality of second conductive pads are configured to contact a plurality of third pads on a corresponding chip arranged on a separate substrate.

9. The semiconductor test apparatus of claim 8, wherein the first conductive pads are larger than the second conductive pads.

10. The semiconductor test apparatus of claim 7, wherein
the first conductive pads include a plurality of first conductive connection wires in the plurality of first grooves in the first surface of the semiconductor substrate and a plurality of first conductive patterns on the first connection wires, the first conductive pattern protruding from the first surface of the semiconductor substrate,
the second conductive pads include a plurality of conductive second connection wires in the plurality of second grooves in the second surface of the semiconductor substrate and a plurality of second conductive patterns on the second connection wires, the second conductive patterns protruding from the second surface of the semiconductor substrate, and
the first connection wires are electrically directly connected to the second connection wires.

11. The semiconductor test apparatus of claim 7, wherein
the first conductive pads include first a plurality of first conductive connection wires in the plurality of in the first surface of the semiconductor substrate and a plurality of first conductive balls on the first connection wires, the first conductive balls protruding from the first surface of the semiconductor substrate,
the second conductive pads include a plurality of second conductive connection wires in the plurality of second grooves in the second surface of the semiconductor substrate and a plurality of second conductive balls on the second connection wires, the second conductive balls protruding from the second surface of the semiconductor substrate, and
the first connection wires are electrically directly connected to the second connection wires.

12. A method of fabricating a wafer type probe card, comprising:
forming a plurality of first grooves in a first surface of each of a plurality of probing areas of a semiconductor substrate;
forming a plurality of first pads in the plurality of first grooves in the first surface so that at least one surface of each of the first pads protrudes from a first surface of the substrate;
forming a plurality of second grooves in a second surface of each of the plurality of probing areas of the semiconductor substrate to expose portions of the plurality of the first pads; and
forming a plurality of second pads in the plurality of first grooves in the first surface so that at least one surface of each of the second pads protrudes from a second surface of the substrate and so that the plurality of second pads are electrically connected with the exposed portions of the plurality of second pads.

13. The method of claim 12, further comprising:
forming a plurality of connection wires in the plurality of the first grooves or in the plurality of the second grooves in the semiconductor substrate before forming the plurality of first pads, and wherein
the plurality of connection wires electrically connect each of the first pads to a corresponding second pad.

14. The method of claim 12, wherein
the forming a plurality of first grooves and the forming a plurality of first pads include,
forming a first mask pattern on the first surface of the semiconductor substrate, the first mask pattern including a plurality of first openings exposing portions of the first surface of the semiconductor substrate,
etching the exposed portions of the first surface using the first mask pattern to form the plurality of first grooves in the first surface,
depositing a first metal material in each of the first grooves and in each of the first openings to form the plurality of first pads, and removing the first mask pattern; and the forming a plurality of second grooves and a plurality of second pads include, forming a second mask pattern on the second surface of the semiconductor substrate, the second mask pattern including a plurality of second openings exposing portions of the second surface of the semiconductor substrate;

etching the exposed portions of the second surface using the second mask pattern to form plurality of second groves in the second surfaces, the plurality of second grooves exposing the portions of the plurality of first pads, depositing a second metal material in each of the second grooves and in each of the second openings to form the plurality of second pads, the plurality of second pads directly connected with the exposed portion of the plurality of first pads; and removing the second mask pattern.

15. The method of claim 14, further comprising:

forming a first insulating layer on the first surface of the semiconductor substrate before the first mask pattern is formed or after the first mask pattern is removed; and forming a second insulating layer on the second surface of the semiconductor substrate before the second mask pattern is formed or after the second mask pattern is removed.

16. The method of claim 12, wherein the forming a plurality of first grooves and the forming a plurality of first pads include, forming a first mask pattern on the first surface of the semiconductor substrate, the first mask pattern exposing portions of the first surface of the semiconductor substrate, etching the exposed portions of the first surface using the first mask pattern to form the plurality of first grooves in the first surface, depositing a first metal material in each of the first grooves to form a plurality of first connection wires, removing the first mask pattern, and forming a first conductive pattern on each of the first connection wires; and the forming a plurality of second grooves and a plurality of second pads include, forming a second mask pattern on the second surface of the semiconductor substrate, the second mask pattern exposing portions of the second surface of the semiconductor substrate, etching the exposed portions of the second surface using the second mask pattern to form the plurality of second groves in the second surface, the plurality of second grooves exposing portions of the plurality of the first connection wires, depositing a second metal material in each of the second grooves to form a plurality of second connection wires such that each of the first connection wires are electrically connected with a corresponding second connection wire, removing the second mask pattern, and forming a second conductive pattern on each of the second connection wires.

17. The method of claim 16, further comprising:

forming a first insulating layer on the first surface of the semiconductor substrate before or after the first conductive pattern is formed; and forming a second insulating layer on the second surface of the semiconductor substrate before or after the second conductive pattern is formed.

18. The method of claim 12, wherein the forming a plurality of first grooves and the forming a plurality of first pads include, forming a first mask pattern on the first surface of the semiconductor substrate, the first mask pattern exposing portions of the first surface of the semiconductor substrate, etching the exposed portions of the first surface using the first mask pattern to form the plurality of first grooves in the first surface, depositing a first metal material in each of the first grooves to form a plurality of first connection wires, removing the first mask pattern, and forming a first conductive ball on each of the first connection wires; and the forming a plurality of second grooves and a plurality of second pads include, forming a second mask pattern on the second surface of the semiconductor substrate, etching the exposed portions of the second surface using the second mask pattern to form the plurality of second groves in the second surface, the plurality of second grooves exposing portions of the plurality of first connection wires, depositing a second metal material in each of the second grooves to form a plurality of second connection wires so that each of the first connection wires is electrically connected with a corresponding second connection wire, removing the second mask pattern, and forming a second conductive ball on each of the second connection wires.

19. The method of claim 18, further comprising:

forming a first insulating layer on the first surface of the semiconductor substrate before or after the first conductive ball is formed; and forming a second insulating layer on the second surface of the semiconductor substrate before or after the second conductive ball is formed.

* * * * *